United States Patent
Wu et al.

(10) Patent No.: US 11,024,614 B2
(45) Date of Patent: Jun. 1, 2021

(54) METHOD FOR MANUFACTURING MICRO LED PANEL AND MICRO LED PANEL THEREOF

(71) Applicant: UNITY OPTO TECHNOLOGY CO., LTD., New Taipei (TW)

(72) Inventors: Ching-Huei Wu, New Taipei (TW); Wei-Chung Lin, New Taipei (TW)

(73) Assignee: UNITY OPTO TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 16/782,077

(22) Filed: Feb. 5, 2020

(65) Prior Publication Data

US 2021/0091049 A1  Mar. 25, 2021

(30) Foreign Application Priority Data

Sep. 20, 2019  (TW) .................. 108134124

(51) Int. Cl.
| | |
|---|---|
| *H01L 25/075* | (2006.01) |
| *H01L 33/62* | (2010.01) |
| *H01L 33/50* | (2010.01) |
| *H01L 33/00* | (2010.01) |

(52) U.S. Cl.
CPC ...... *H01L 25/0753* (2013.01); *H01L 33/0093* (2020.05); *H01L 33/505* (2013.01); *H01L 33/62* (2013.01); *H01L 2933/0041* (2013.01); *H01L 2933/0066* (2013.01)

(58) Field of Classification Search
CPC ............. H01L 25/0753; H01L 33/0093; H01L 33/505; H01L 33/62; H01L 2933/0041; H01L 2933/0066; H01L 33/504; H01L 33/32; H01L 33/50; H01L 33/502

See application file for complete search history.

(56) References Cited

U.S. PATENT DOCUMENTS

| | | | | |
|---|---|---|---|---|
| 2016/0351539 | A1* | 12/2016 | Bower | H01L 25/0655 |
| 2016/0372893 | A1* | 12/2016 | McLaurin | H01S 5/32341 |
| 2019/0058080 | A1* | 2/2019 | Ahmed | H01L 24/95 |
| 2019/0058085 | A1* | 2/2019 | Ahmed | H01L 33/18 |
| 2020/0072441 | A1* | 3/2020 | Wu | H01L 25/0753 |
| 2020/0185360 | A1* | 6/2020 | Sun | H01L 33/62 |
| 2020/0295225 | A1* | 9/2020 | Hsieh | H01L 25/0753 |
| 2020/0388736 | A1* | 12/2020 | Chen | H01L 25/0753 |

* cited by examiner

*Primary Examiner* — Bo B Jang
(74) *Attorney, Agent, or Firm* — Fei-hung Yang

(57) ABSTRACT

A method for manufacturing micro LED panel and micro LED panel thereof is disclosed. The method includes defining a plurality of pixel regions on an optical element carrier; providing a first solder portion, or a first solder portion, a second solder portion and a third solder portion in each pixel region; selecting a plurality of process substrates and defining a process area on each process substrate; setting a first process mode, a second process mode and a third process mode, and determining the number of process substrates in the first process mode, the second process mode and the third process mode according to the number of units; then the process area of the process substrate will form a plurality of first micro light emitting chips corresponding to the position of the first soldering portion.

40 Claims, 21 Drawing Sheets

Set a first process mode, a second process mode and a third process mode, wherein the first process mode uses the process area as a unit to calculate the number of units of the optical element carrier and determine the number of process substrates of the first process mode according to the number of units, and the process area of the process substrate has a plurality of first micro light emitting chips formed thereon and configured to be corresponsive to the first solder portions respectively; the second process mode also uses the process area as a unit to calculate the number of units of the optical element carrier and determine the number of process substrates of the second process mode according to the number of units, and the process area of the process substrate has a plurality of second micro light emitting chips formed thereon and configured to be corresponsive to the second solder portions respectively; the third process mode also uses the process area as a unit to calculate the number of units of the optical element carrier and determine the number of process substrates of the third process mode according to the number of units, and the process area of the process substrate has a plurality of second micro light emitting chips formed thereon and configured to be corresponsive to the third solder portions respectively; the first micro light emitting chips, the second micro light emitting chips and the third micro light emitting chips have light colors different from each other ~S204

Fig. 1B (B)

| Transfer and fix the first micro light emitting chips on a single process substrate to the first solder portions of the optical element carrier at a time and then remove the process substrate; transfer and fix the second micro light emitting chips on the single process substrate to the second solder portions of the optical element carrier at a time and then remove the process substrate; and transfer and fix the third micro light emitting chips on a single process substrate to the third solder portions of the optical element carrier at a time and then remove the process substrate, until all of the first solder portions have the first micro light emitting chip, all of the second solder portions have the second micro light emitting chip, and all of the third solder portions have the third micro light emitting chip, so that each pixel region emits a white light | ～S205 |

Fig. 1C

METHOD FOR MANUFACTURING MICRO LED PANEL AND MICRO LED PANEL THEREOF

CROSS-REFERENCE TO RELATED APPLICATIONS

This non-provisional application claims priority under 35 U.S.C. § 119(a) on Patent Application No(s). 108134124 filed in Taiwan, R.O.C. on Sep. 20, 2019, the entire contents of which are hereby incorporated by reference.

BACKGROUND

Technical Field

The present disclosure generally relates to the field of micro LED panels. More particularly, the present disclosure relates to a method for manufacturing a micro LED panel and the micro LED panel manufactured by the method capable of forming micro LED chips of a single light color and satisfying the requirements of the light color and position of the chips required by a micro LED display, and then transferring the micro LED chips to an optical element carrier at a time according to predetermined conditions, so as to improve the manufacturing efficiency and yield of the micro LED panel.

Description of Related Art

In general, a light emitting diode (LED) is an electronic semiconductor capable of emitting light and has the advantages of low power consumption, high power, high directivity, and high contrast, and thus it is used extensively in different types of electronic components that emit light, and its most common usage is in the area of display devices. In a display device, the LED is provided as a main backlight source which is mainly divided into direct-lit backlight and edge-lit backlight according to its light supply direction relative to the display panel. The light output direction of the direct-lit backlight is perpendicular to the display panel to allow the panel to receive light and achieve a screen display effect. However, the physical structure of the direct-lit and edge lit backlights includes many components such as a light guide plate, a liquid crystal plate, etc., and thus incurring a higher cost of the product. On the other hand, the conventional direct-lit and edge-lit backlights are well-developed technologies, but they still have bottlenecks and limitations that require further adjustments and improvements.

As the LED manufacturing technology advances, micro LEDs are introduced to the market in recent years. Since the technology of micro LEDs has technical advantages comparable with OLED, major manufacturers of the related industry spare no effort on the research and development of this technology, so that novel products with the display device made of micro LEDs are developed rapidly. In the areas of applying the micro LED as a display device, it is necessary to overcome barriers from the epitaxial manufacturing process, die production, driving IC and massive transfer to the bonding process. Particularly, a massive chip transfer is one of the technical issues that each manufacturer has to overcome.

In view of the aforementioned problems of the prior art, the discloser of the present disclosure based on years of experience in the related industry to conduct extensive research and experiment, and finally provided a method for manufacturing a micro LED panel and a product manufactured by the method in order to provide excellent micro LED products.

SUMMARY

To achieve the aforementioned and other objectives, the present disclosure provides a method for manufacturing a micro LED panel and the micro LED panel thereof, and the method uses a new manufacturing technology to improve the product yield and overall performance of the micro LED panel, the subsequent luminous effect, and the contrast and image display resolution of the display device effectively.

The method for manufacturing a micro LED panel of this disclosure comprises the steps of: defining a plurality of pixel regions on an optical element carrier, each being arranged substantially into a matrix; defining a plurality of pixel regions in an optical element carrier, each being arranged substantially into a matrix; providing at least one first solder portion, a second solder portion and a third solder portion in each pixel region; setting a first process mode, a second process mode and a third process mode, wherein the first process mode uses the process area as a unit to calculate the number of units of the optical element carrier and then determine the number of process substrates of the first process mode according to the number of units, and the process area of the process substrate is configured to be corresponsive to the first solder portions to form a plurality of first micro light emitting chips; wherein the second process mode also uses the process area as a unit to calculate the number of units of the optical element carrier and then determine the number of process substrates of the second process mode according to the number of units, and the process area of the process substrate is configured to be corresponsive to the second solder portions to form a plurality of second micro light emitting chips; wherein the third process mode also uses the process area as a unit to calculate the number of units of the optical element carrier and then determine the number of process substrates of the third process mode according to the number of units, and the process area of the process substrate is configured to be corresponsive to the third solder portions to form a plurality of third micro light emitting chips; wherein the light colors of the first micro light emitting chips, the second micro light emitting chips and the third micro light emitting chips are different from each other; the first micro light emitting chips on a single the process substrate are transferred and fixed to the first solder portions of the optical element carrier at a time, and then the process substrate is removed; the second micro light emitting chips on a single the process substrate are transferred and fixed to the second solder portions of the optical element carrier at a time and then the process substrate is removed; the third micro light emitting chips on a single the process substrate are transferred and fixed to the third solder portions of the optical element carrier and then the process substrate is removed, until all of the first solder portions have the first micro light emitting chip, and all of the second solder portions have the second micro light emitting chip, and all of the third solder portions have the third micro light emitting chip, so that the pixel regions emit a white light. This novel manufacturing method is used to manufacture micro LED panels quickly and accurately, so that the micro LED panels have more flexible settings and a very good manufacturing yield. This manufacturing method no longer needs to decide and select the number and position of the chips to be transferred each time when the chips on the process substrate are transferred to the optical element carrier and avoids the inconvenience and delay. Compared with the conventional manufacturing method, this disclosure has an excellent manufacturing efficiency.

This disclosure also discloses a micro LED panel manufactured by the aforementioned manufacturing method, and the micro LED panel comprises: an optical element carrier, having a plurality of pixel regions defined therein, wherein each pixel region is arranged substantially into a matrix; a plurality of first solder portions, disposed in the pixel region respectively; a plurality of second solder portions, disposed in the pixel regions respectively and situated on a side of the first solder portion; a plurality of third solder portions, disposed in the pixel regions respectively and situated on a side of the first solder portion or the second solder portion; a plurality of first micro light emitting chips, soldered onto the first solder portions respectively; a plurality of second micro light emitting chips, soldered onto the second solder portions respectively; and a plurality of third micro light emitting chips, soldered onto the third solder portions respectively; wherein the first micro light emitting chips, the second micro light emitting chips and the third micro light emitting chips have different colors from each other, so that the pixel regions emit a white light. Therefore, the manufacture of micro LED panels gives a very good product yield, and the micro LED panels can be custom-manufactured according to different display requirements.

Based on the aforementioned technical content, the first solder portion, the second solder portion and the third solder portion in each pixel region are arranged along the X-axis direction or the Y-axis direction to form a 1×3 matrix, each first solder portion has two first solder joints, each second solder portion has two second solder joints, and each third solder portion has two third solder joints, so that the micro LED panel so manufactured has a better light color driving performance.

In a preferred embodiment, the light color of the first micro light emitting chips is a red color, the light color of the second micro light emitting chips is a green color, the light color of the third micro light emitting chips is a blue color, and these light colors can be mixed to produce a white light.

Each pixel region has two first solder portions, one second solder portion and one third solder portion, wherein the first solder portions, the second solder portion and the third solder portion are arranged into a 2×2 matrix, and the first solder portions are arranged diagonally with respect to each other to provide another arrangement applied for driving the display.

In a preferred embodiment, the light color of the first micro light emitting chips is a green color, the light color of the second micro light emitting chips is a blue color, and the light color of the third micro light emitting chips is a red color, wherein these light colors can be mixed to produce a white light.

Based on the aforementioned two arrangements, the process substrates of this disclosure are preferably cut before the first micro light emitting chips, the second micro light emitting chips or the third micro light emitting chips are transferred and fixed, wherein each process substrate is cut along an edge of the process area into a shape corresponding to the process area, so that each process substrate can be arranged sequentially to achieve the positioning effect when the microchips of the same light color are transferred to the process substrates at a time.

Preferably, the optical element carrier has a first positioning portion defined at a position without the pixel regions; at least one of the process substrates has a second positioning portion, and the first positioning portion and the second positioning portion are configured to be corresponsive to each other to confirm the transferring and fixing position when the first micro light emitting chips, the second micro light emitting chips or the third micro light emitting chips are transferred and fixed to the optical element carrier, so as to achieve the positioning effect in the transferring and fixing process.

Further, when the optical element carrier already has some of the first micro light emitting chips or the second micro light emitting chips and the process substrate is transferred and fixed, any one of the first micro light emitting chips, the second micro light emitting chips or the third micro light emitting chips is used as positioning point to confirm the transferring and fixing position. When it is necessary to transfer the first micro light emitting chips, the second micro light emitting chips or the third micro light emitting chips of a plurality of process substrates to the optical element carrier, the later transferred and fixed process substrate can use the first micro light emitting chips, the second micro light emitting chips or the third micro light emitting chips latestly or previously transferred to the optical element carrier as a positioning point to reduce the alignment difficulty and improve the transfer accuracy.

The present disclosure also discloses a method for manufacturing a micro LED panel comprising the steps of: defining a plurality of pixel regions on an optical element carrier, each being arranged substantially into a matrix; setting a plurality of first solder portions in each pixel region; selecting a plurality of process substrates and defining a process area on each process substrate; setting a first process mode, wherein the first process mode uses the process area as a unit to calculate the number of units of the optical element carrier and then determines the number of process substrates of the first process mode according to the number of units, and the process area of the process substrate is configured to be corresponsive to the first solder portions to form a plurality of first micro light emitting chips; transferring and fixing the first micro light emitting chips on the single process substrate to the first solder portions of the optical element carrier at a time, and removing the process substrate, until all of the first solder portions have the first micro light emitting chip; and spraying or attaching a photo-excited structure to some of the first micro light emitting chips in each pixel region, so that each pixel region emits a white light. This novel manufacturing method is used to manufacture micro LED panels quickly and accurately, so that the micro LED panels have more flexible settings and a very good manufacturing yield. This manufacturing method no longer needs to decide and select the number and position of the chips to be transferred each time when the chips on the process substrate are transferred to the optical element carrier and avoids the inconvenience and delay. Compared with the conventional manufacturing method, this disclosure has an excellent manufacturing efficiency.

The present disclosure also discloses a micro LED panel manufactured by the aforementioned manufacturing method, and the micro LED panel comprises: an optical element carrier, having a plurality of pixel regions defined therein, wherein each pixel region is arranged substantially into a matrix; a plurality of first solder portions, disposed in the pixel region respectively; a plurality of first micro light emitting chips, soldered on the first solder portions respectively; and a plurality of photo-excited structures, sprayed or attached onto some of the first micro light emitting chips in each pixel region, so that each pixel region emits a white light. This manufacturing method of the micro LED panel has the advantages of simple and accurate manufacture and its application provides an improved display effect by the accurate and precise manufacturing method.

Based on the aforementioned technical content, the first solder portions in each pixel region are preferably arranged along the X-axis direction or the Y-axis direction to form a 1×3 matrix, and each first solder portion has two first solder joints.

Preferably, the light color of the first micro light emitting chips is a blue color and the light color of the first micro light emitting chip after being sprayed or attached with the photo-excited structure is a green color or a red color, so that each pixel region emits its required light color.

Each pixel region has four first solder portions defined therein, and the first solder portions are arranged into a 2×2 matrix, and each first solder portion has two first solder joints.

Preferably, the process substrates are cut before the first micro light emitting chips are transferred and fixed, wherein each process substrate is cut along an edge of the process area into a shape corresponding to the process area to improve the convenience and efficiency of the chip transfer.

Preferably, the optical element carrier has a first positioning portion situated at a position not defined by the pixel regions; at least one of the process substrates has a second positioning portion provided for configuring the first positioning portion to be corresponsive to the second positioning portion in order to confirm the transferring and fixing position when the first micro light emitting chips, the second micro light emitting chips or the third micro light emitting chips are transferred and fixed to the optical element carrier. Therefore, a better positioning performance can be achieved during the transfer, so as to prevent any deviation produced during the chip transfer of the optical element carrier.

Preferably, when the optical element carrier already has some of the first micro light emitting chips installed thereon and the process substrate is transferred and fixed, any one of the first micro light emitting chips is used as a positioning point to confirm the transferring and fixing position, so as to further improve the transfer efficiency and reduce the alignment difficulty.

Preferably, the light color of the first micro light emitting chips is a blue color, and the light color of the first micro light emitting chip after being sprayed or attached with the photo-excited structure is a green color or a red color, and the light color of the of the two first micro light emitting chips in each pixel region after being sprayed or attached with the photo-excited structure is a green color, and the two first micro light emitting chips are arranged diagonally with respect to each other, so that each pixel region emits its required light color.

In summation of the description above, the method for manufacturing a micro LED panel and its product in accordance with this disclosure adopts a novel manufacturing process to manufacture a product using a micro LED as a light emitting source to overcome the inconvenience of the conventional manufacturing process. This disclosure bases on the desired generation status to compute the number and position of the chips required to be transferred onto the process substrate, and then transfer and fix all of the chips on the single process substrate at a time, so as to assure the accuracy of the chip transfer position and prevent deviations occurred in the light emitting area, and the one-time transfer and fixing process can simplify the control the factors and inconvenience of the manufacturing process, and no longer requires the determination of the separation order of each chip for the transfer process. For such small size of the micro LED, if it still needs to set the order of transferring and fixing the chips onto the optical element carrier one by one during the transferring and fixing process, then the manufacturing time will be delayed significantly, and the efficiency will be lowered, and the transfer position will be deviated easily. In other words, the conventional manufacturing method of the micro LED related products will not make adjustments or set configurations according to the chip position of the final product during the formation of the micro LED chip. In general, a largest possible number of chips are formed on the process substrate, and there is no technical concept related to the configuration and generation position at all. On the other hand, this disclosure has a close association between the formation of the micro LED chips and the chip configuration position of the final product, and many factors including the subsequent transfer convenience, transfer speed and transfer accuracy are taken into consideration for the formation of the chips, so that the manufactured product has an excellent light output performance.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1B is a flow chart continuing the first flow chart in FIG. 1A;

FIG. 1C is a flow chart continuing the first flow chart in FIG. 1B;

DESCRIPTION OF THE EMBODIMENTS

Figure 1A:
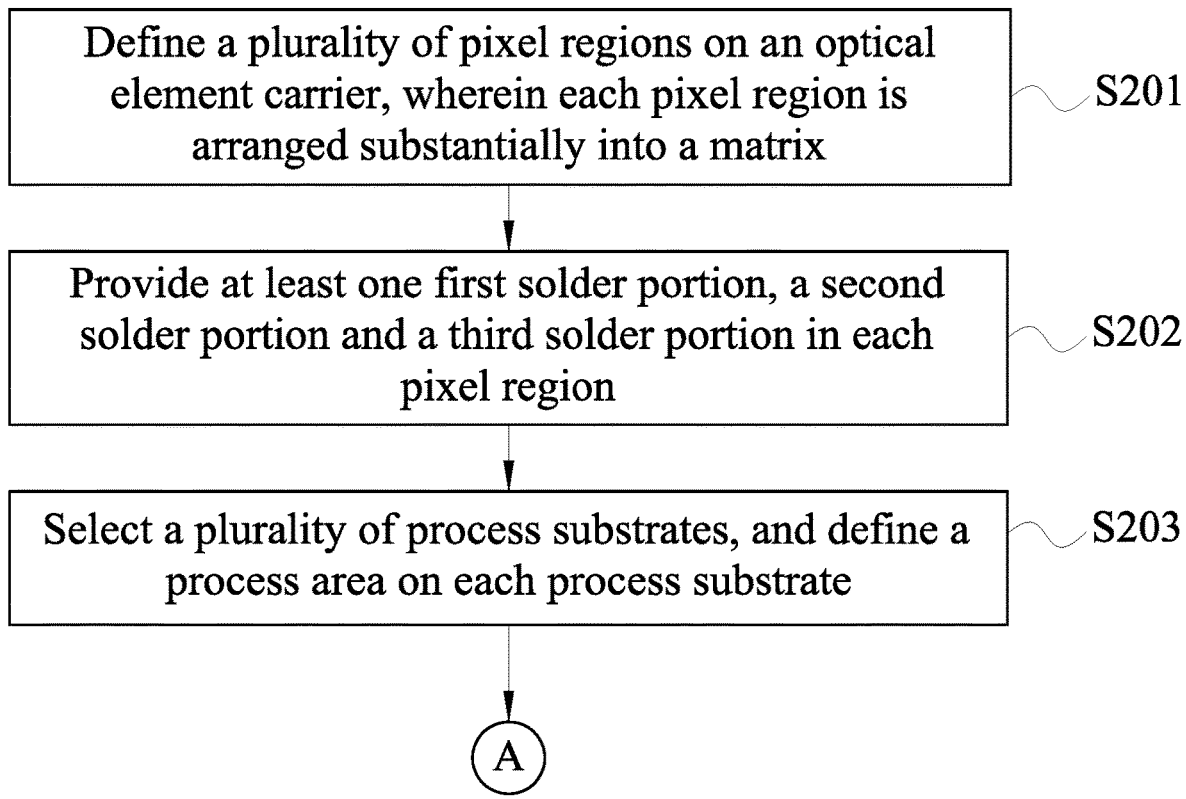
FIG. 1A is a first flow chart of a method for manufacturing a micro LED panel in accordance with a first embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In view of the very small size of the micro LED and the threshold and difficulty of transferring and fixing chips such as the transfer speed, the transfer position, and the yield after the formation of the chips, which is one of the reasons that the micro LED still cannot be used popularly, the disclosure of this disclosure based on years of experience in the related industry to conduct extensive research and experiments, and finally developed a high-performance micro LED to be used as a display device and provided a novel method for manufacturing the micro LED panel to manufacture panels products with an excellent light emission performance.

With reference to FIGS. 1A, 1B, 1C and 2 for the flow charts of a method for manufacturing a micro LED panel and a schematic view of an optical element carrier in accordance with the first embodiment of this disclosure respectively, the method for manufacturing a micro LED panel comprises the following steps.

S201: Define a plurality of pixel regions 30 on an optical element carrier 3, wherein each pixel region 30 is arranged substantially into a matrix, wherein the optical element carrier 3 may be made of FR4 fiber, BT resin, FPC, glass, silicon, or ceramic, etc., and the pixel regions 30 are defined on the optical element carrier 3 according to the required display requirements.

Step S202: Provide at least one first solder portion 31, a second solder portion 32 and a third solder portion 33 in each pixel region 30 which are used as a basis for installing subsequent chips. It is noteworthy that the optical element carrier 3 of this disclosure adopts a mutual pairing connection concept and a fractional stamping method for the transfer, so that irregular transfer may occur during the transfer process, but the optical element carrier 3 will have a whole surface with a complete pixel arrangement after the overall transfer is completed, and such optical element carrier 3 with the transfer chips can be used directly as the display device. Each step will be described and illustrated below.

Figure 2:
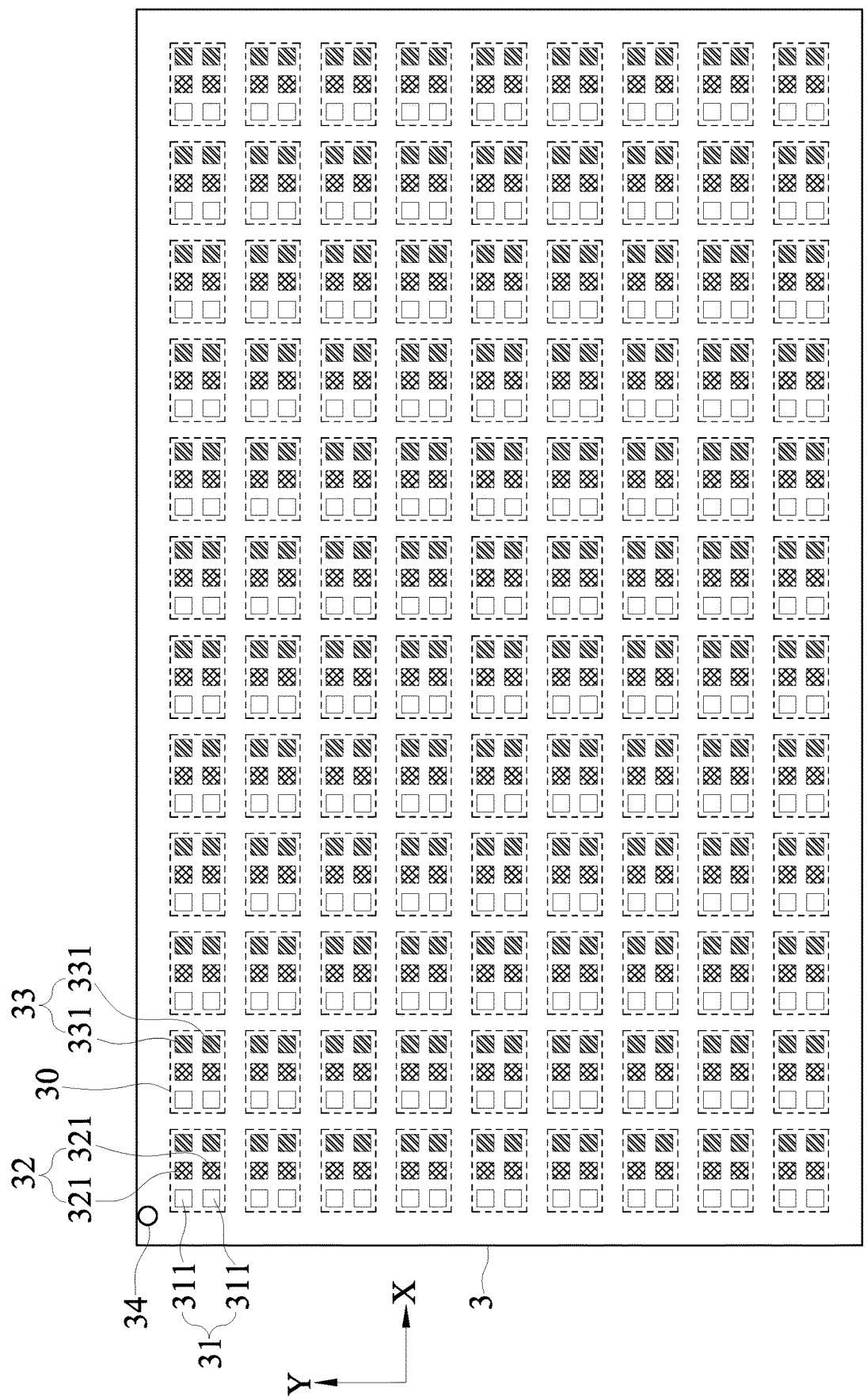
FIG. 2 is a schematic view of an optical element carrier in accordance with the first embodiment of this disclosure.

In a preferred embodiment of this disclosure, the first solder portion 31, the second solder portion 32 and the third solder portion 33 in each pixel region 30 are arranged along the X-axis direction or the Y-axis direction to form a 1×3 matrix, wherein each first solder portion 31 has two first solder joints 311, each second solder portion 32 has a two second solder joints 321, and each third solder portion 33 has two third solder joints 331. The first solder portion 31, the second solder portion 32 and the third solder portion 33 in each pixel region 30 are arranged along the X-axis direction as shown in FIG. 2. Of course, the first solder portion 31, the second solder portion 32 and the third solder portion 33 may also be arranged along the Y-axis direction. The first solder joints 311, the second solder portions 321 and the third solder joints 331 are used as an electric conductive contact for electrically conducting the chips with the optical element carrier 1 after the chip transfer, and the installation of the first solder joints 311, the second solder portions 321 and the third solder joints 331 allows manufacturers to configure the electric connection between the solder portions according to the requirements.

Step S203: Set the plurality of process substrates 4 on each process substrate 4 to define a process area 40 as shown in the schematic view of the process substrate of the first embodiment of this disclosure, and select the desired type and size of process substrates are selected after the first solder portion 31, the second solder portion 32 and the third solder portion 33 are set on each pixel region 40, and the process area 40 of the process substrates 4 are defined to facilitate the subsequent procedure.

S204: Set a first process mode, a second process mode and a third process mode, wherein the first process mode uses the process area 40 as a unit, and calculate the number of units of the optical element carrier 3, and determine the number of process substrates of the first process mode according to the number of units, and the process area 40 of the process substrate 4 is configured to be corresponsive to the first solder portions 31 to form a plurality of first micro light emitting chips 41; the second process mode also uses the process area 40 as a unit to calculate the number of units of the optical element carrier 3, and then determine the of the second process mode according to the number of units, and the process area 40 of the process substrate 4 is configured to be corresponsive to the second solder portions 32 to form a plurality of second micro light emitting chips 42; and the third process mode also uses the process area 40 as a unit to calculate the number of units of the optical element carrier 3 and then determine the number of process substrates of the third process mode according to the number of units, and the process area 40 of the process substrate 4 is configured to be corresponsive to the third solder portions 33 to form a plurality of third micro light emitting chips 43. Wherein, the light colors of the first micro light emitting chips 41, the second micro light emitting chips 42 and the third micro light emitting chips 43 are different from each other.

Figure 3:
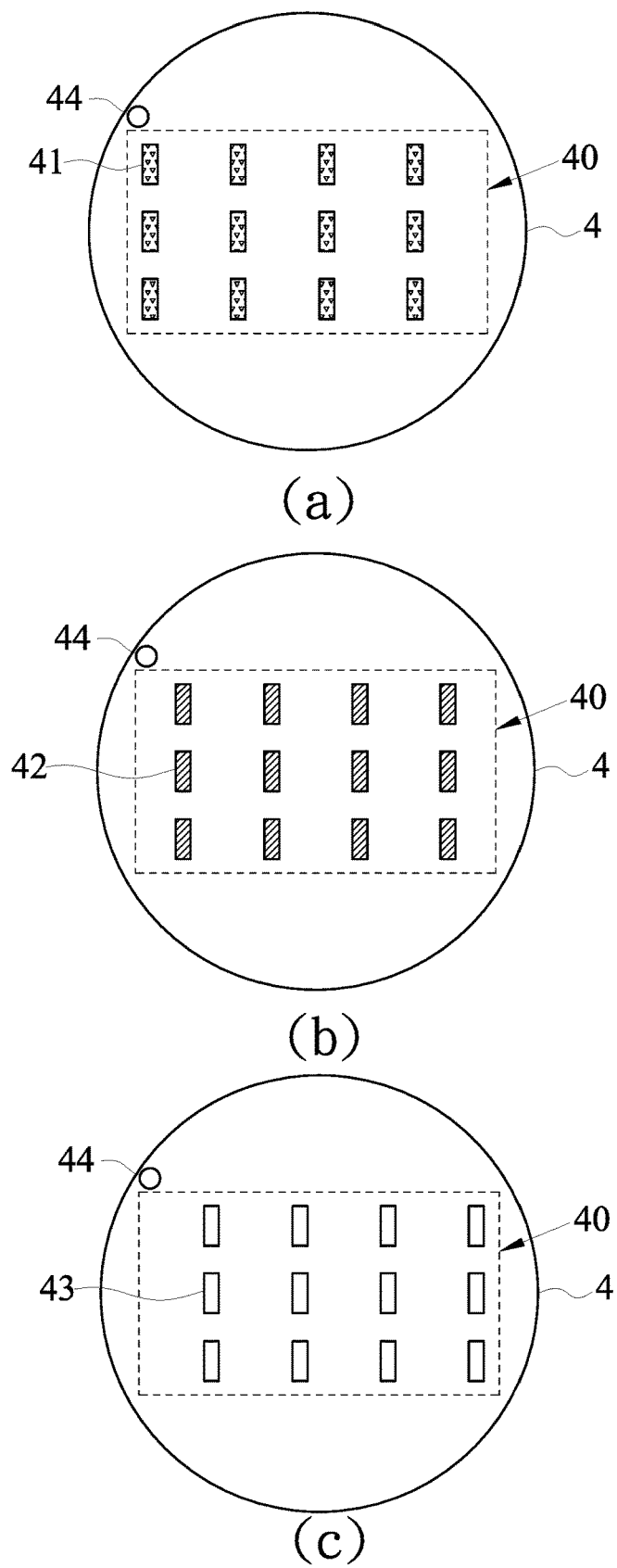
FIG. 3 is a schematic view of each process substrate in accordance with the first embodiment of this disclosure.

FIG. 3(a) shows the process substrate 4 of the first process mode which is a status facilitating the process area 40 to align with the first solder portions 31 to form the first micro light emitting chips; FIG. 3(b) shows the process substrate 4 of the second process mode which is a status facilitating the process area 40 to align with the second solder portions 32 to form the second micro light emitting chips 42; and FIG. 3(c) shows the process substrate 4 of the third process mode which is a status facilitating the process area 40 to align with the third solder portions 33 to form the third micro light emitting chips 43.

To compute the number and arranged position of the first micro light emitting chips 41, the second micro light emitting chips 42 and the third micro light emitting chips 43 required for manufacturing the micro LED panel 9 are defined in the process area 40 of each process substrate 4 first after the process substrates 4 are selected, and the process area 40 is used as the region for the subsequent formation of the chips. The first process mode is used for example, and the process area 40 is used as a unit to calculate the number of units of the optical element carrier 3, and then the number of process substrates of the first process mode is determined according to the number of units, and the process area 40 of the process substrate 4 is configured to be corresponsive to the first solder portions 31 to form the first micro light emitting chips 41. Specifically, the number of units may be obtained by comparing the area of the optical element carrier 3 with the area of the process area 40. For example, the number of units of the optical element carrier 3 is calculated to be equal to 9, so that the number of process substrates of the first process mode so required is equal to 9. When the number of units is calculated to be 9.5, it shows that the number of process areas 40 required by the optical element carrier 3 is 9.5, so that ten process areas 40 will be used in the manufacturing process in actual practice, and sufficient process areas 40 are provided for forming the first micro light emitting chips 41. In the process area 40 of each process substrate 4, the first micro light emitting chips 41 are formed according to the arranged position of the first solder portions 31. The second process mode may also use the process area 40 as a unit to calculate the number of units of the optical element carrier 3 and determine the number of process substrates of the second process mode according to the number of units, and the process area 40 of the process substrate 4 is configured to be corresponsive to the second solder portions 32 to form the second micro light emitting chips 42. The calculation method of the third process mode is substantially the same as those of the first process mode and the second process mode, wherein the third micro light emitting chips 43 are formed in the process area 40. In this embodiment, the light color of the first micro light emitting chips 41 is preferably a red color, the light color of the second micro light emitting chips 42 is a green color, and the light color of the third micro light emitting chips 43 is a blue color, so that each pixel region 30 emits its required light color.

It is noteworthy that the first micro light emitting chips 41, the second micro light emitting chips 42 and the third micro light emitting chips 43 are chips (which are single crystal grain but not packaged LED) formed after the chip formation of the process substrate 4 has completed during the manufacturing process, so that the light colors of the first micro light emitting chips 41, the second micro light emitting chips 42 and the third micro light emitting chips 43 are the light color emitted after the chips are driven.

By the method of using the process area 40 as a unit, the number of process substrates of the first process mode, the second process mode and the third process mode so required can be calculated, and the process area 40 of each process substrate 4 is configured to be corresponsive to the first solder portions 31 to form the first micro light emitting chips 41; the process area 40 of each process substrate 4 is configured to be corresponsive to the second solder portions 32 to form the second micro light emitting chips 42; and the process area 40 of each process substrate 4 is configured to be corresponsive to the third solder portions 33 to form the third micro light emitting chips 43. In addition, the light colors of the first micro light emitting chips 41, the second micro light emitting chips 42 and the third micro light emitting chips 43 are different from each other, and these manufactured micro light emitting chips 41, 42, 43 can be used for later applications to achieve the effect of controlling each color for the display individually to allow the display device of the micro LED panel 9 to have better display performance including the performance of color rendering, contrast, etc.

After the first micro light emitting chips 41, the second micro light emitting chips 42 and the third micro light emitting chips 43 are formed in the process area 40 of each process substrate 4, the following transferring and fixing process can be carried out. The first micro light emitting chips 41 on the single process substrate 4 can be transferred and fixed to the first solder portions 31 of the optical element carrier 3 at a time, and then the process substrate 4 is removed; the second micro light emitting chips 42 on the single process substrate 4 can be transferred and fixed to the second solder portions 32 of the optical element carrier 3 at a time, and then the process substrate 4 is removed; and the third micro light emitting chips 43 on the single process substrate 4 can be transferred and fixed to the third solder portions 33 of the optical element carrier 3 at a time, and then the process substrate 4 is removed, until all of the first solder portions 31 have the first micro light emitting chip 41, all of the second solder portions 32 have the second micro light emitting chip 42, and all of the third solder portions 33 have the third micro light emitting chip 43.

Figure 5:
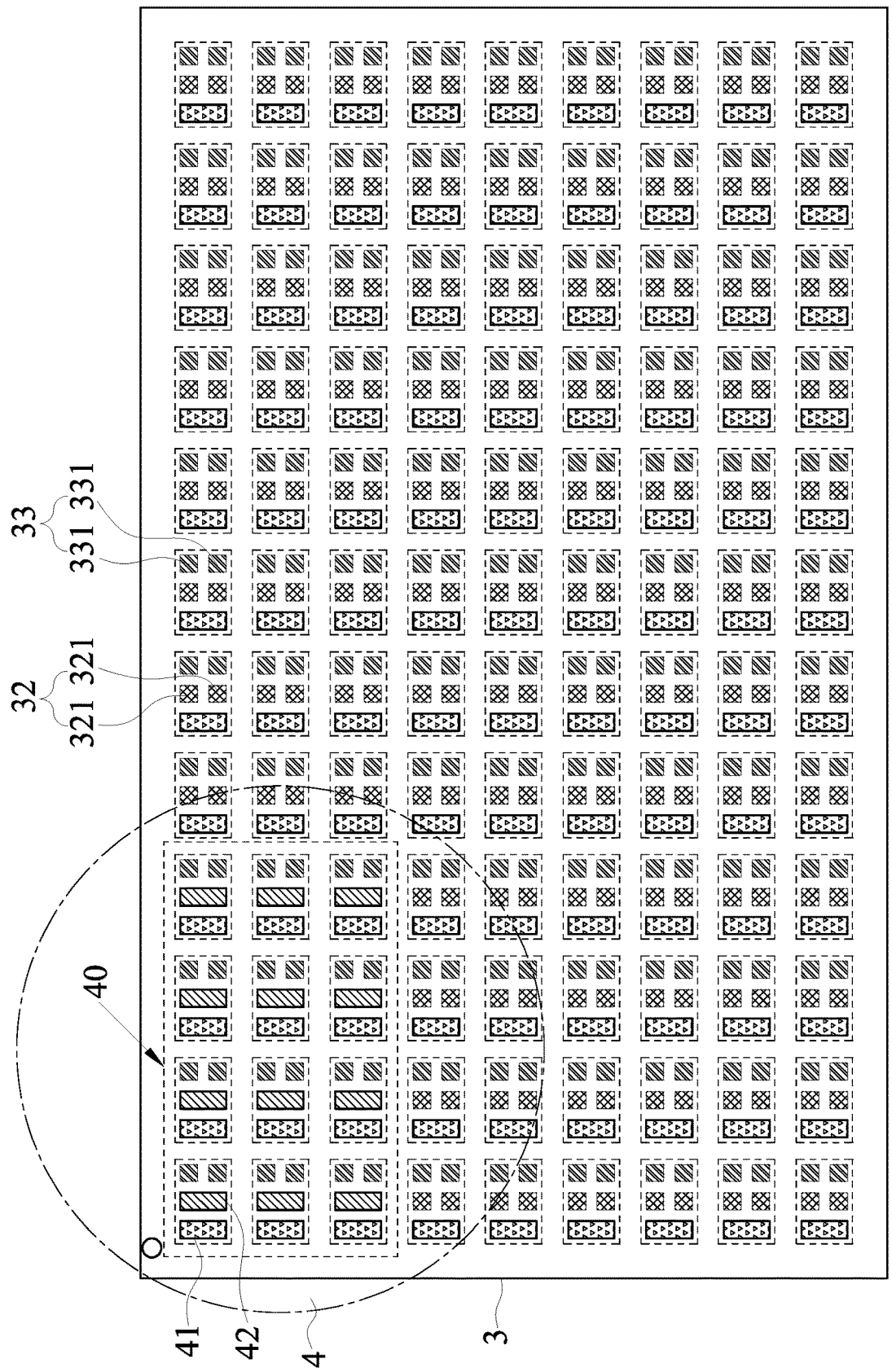
FIG. 5 is a second schematic view showing a chip transfer and fixation in accordance with the first embodiment of this disclosure.
Figure 6:
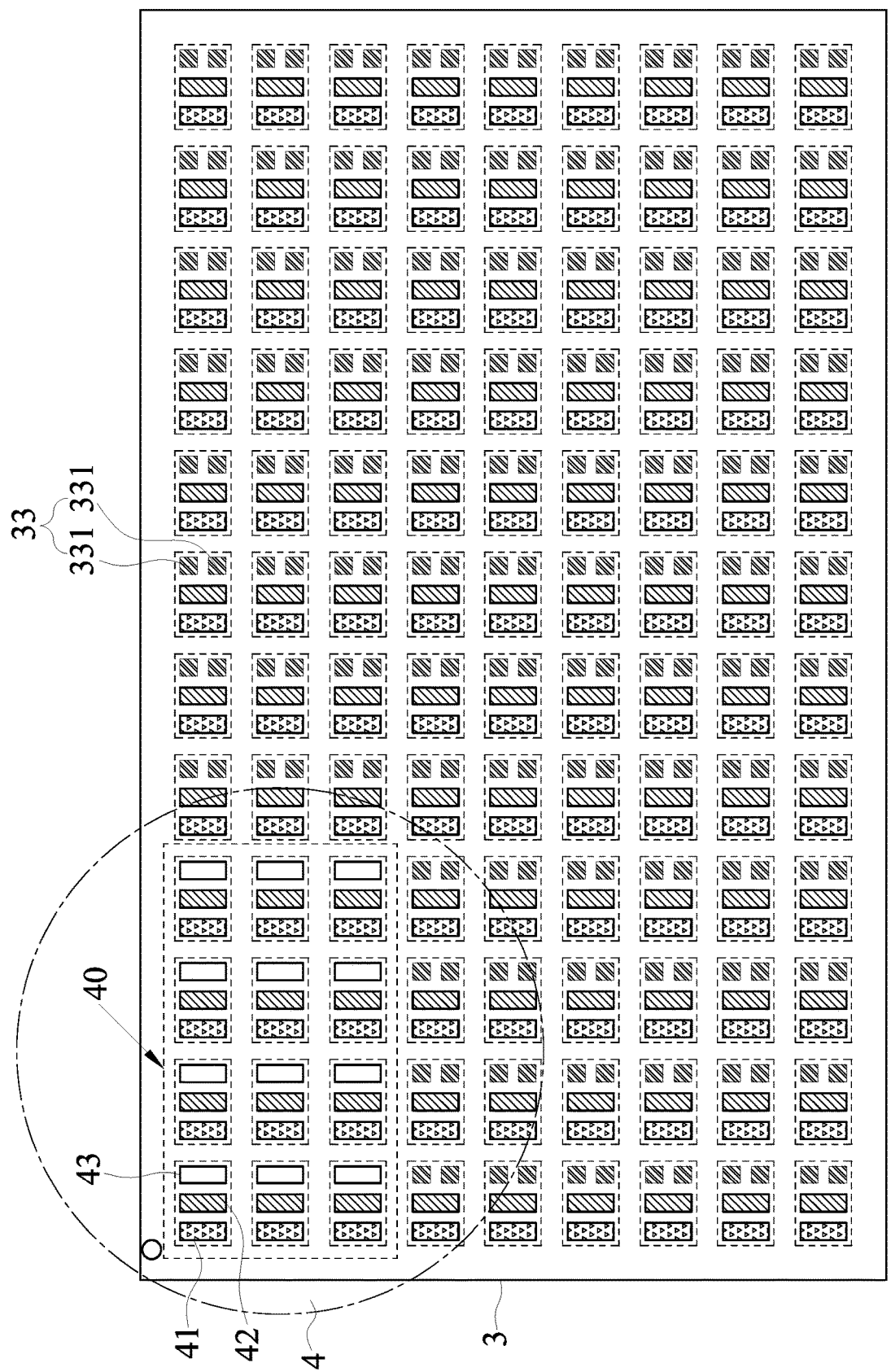
FIG. 6 is a third schematic view showing a chip transfer and fixation in accordance with the first embodiment of this disclosure.
Figure 7:
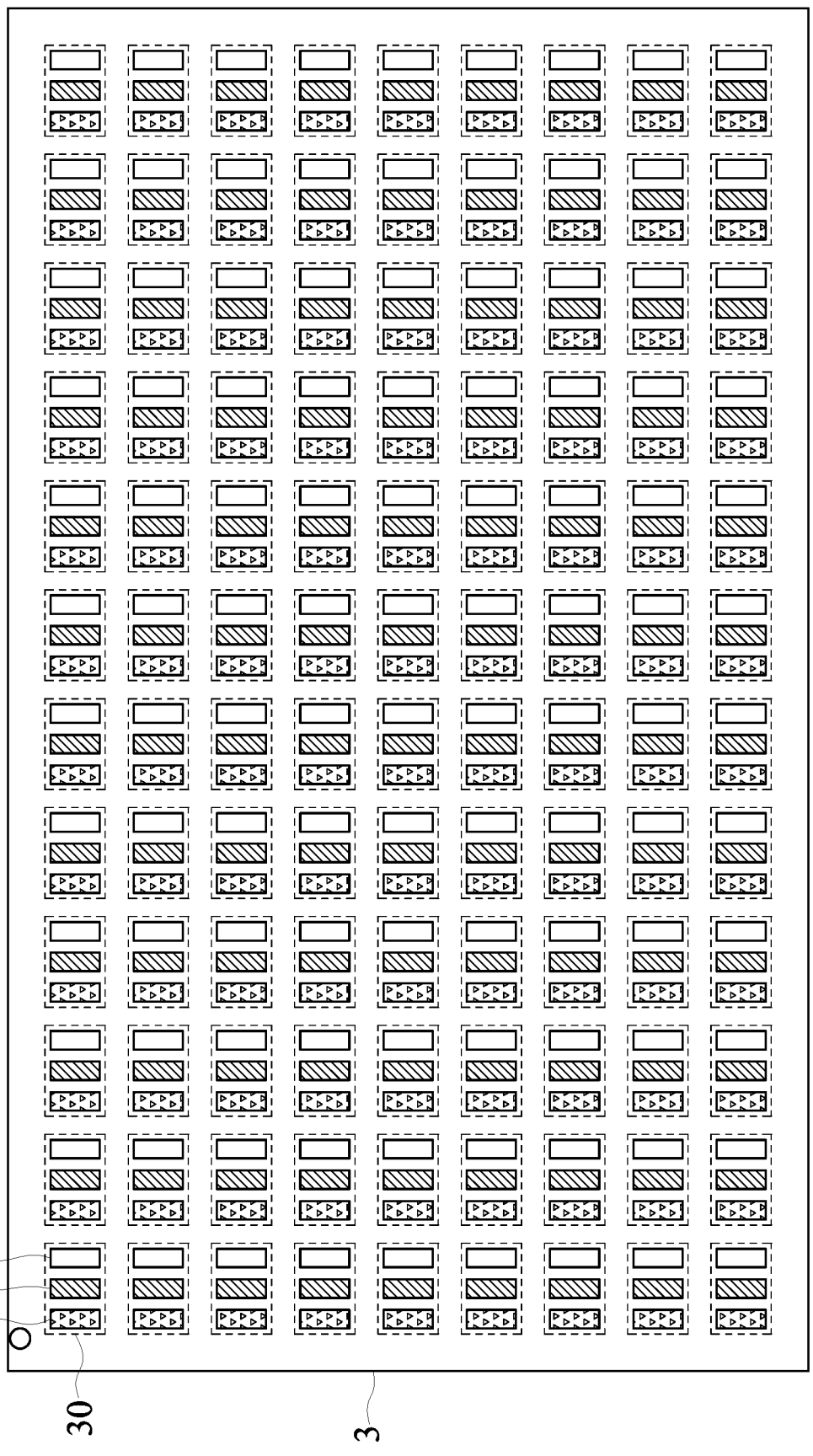
FIG. 7 is a schematic view of a micro LED panel in accordance with the first embodiment of this disclosure.

With reference to FIGS. 4 to 7 for the first to third schematic views of a chip transfer and a schematic view of a micro LED panel in accordance with the first embodiment of this disclosure respectively, when the first micro light emitting chips 41 are transferred to the optical element carrier 3, the process substrate 4 is covered onto the optical element carrier 3, and all of the first micro light emitting chips 41 on the process substrate 4 are aligned with the first solder portions 31 of the first micro light emitting chips 41 respectively, and then the first micro light emitting chips 41 are separated from the process substrate 4 and fixed onto the first solder portions 31 at a time, and then the process substrate 4 is removed. The way of transferring the second micro light emitting chips 42 and the third micro light emitting chips 43 is the same as that of the first micro light emitting chips 41, and thus will not be repeated. In the actual manufacturing process, the transfer of the first micro light emitting chips 41, the second micro light emitting chips 42 and the third micro light emitting chips 43 does not have any specific order, and the first micro light emitting chips 41, the second micro light emitting chips 42 or the third micro light emitting chips 43 of the single process substrate 4 may be transferred and fixed at a time according to the requirements of the manufacturing process. For example, an area is used as the basis of transfer, wherein the first micro light emitting chips 41 of one of the process substrates 4 are transferred to some of the first solder portions 31 of a certain area on the optical element carrier 3, and then the second micro light emitting chips 42 of one of the process substrates 4 are transferred to some of the second solder portions 32 in the area of the optical element carrier 3, and finally the third micro light emitting chips 43 of one of the process substrates 4 are transferred to some of the third solder portions 33 on in the area of the optical element carrier 3. The aforementioned process is repeated until all of the first solder portions 31 have the first micro light emitting chips 41, all of the second solder portions 32 have the second micro light emitting chips 42 and all of the third solder portions 33 have the third micro light emitting chips 43, so as to manufacture the micro LED panel 9 as shown in FIG. 7.

Figure 4:
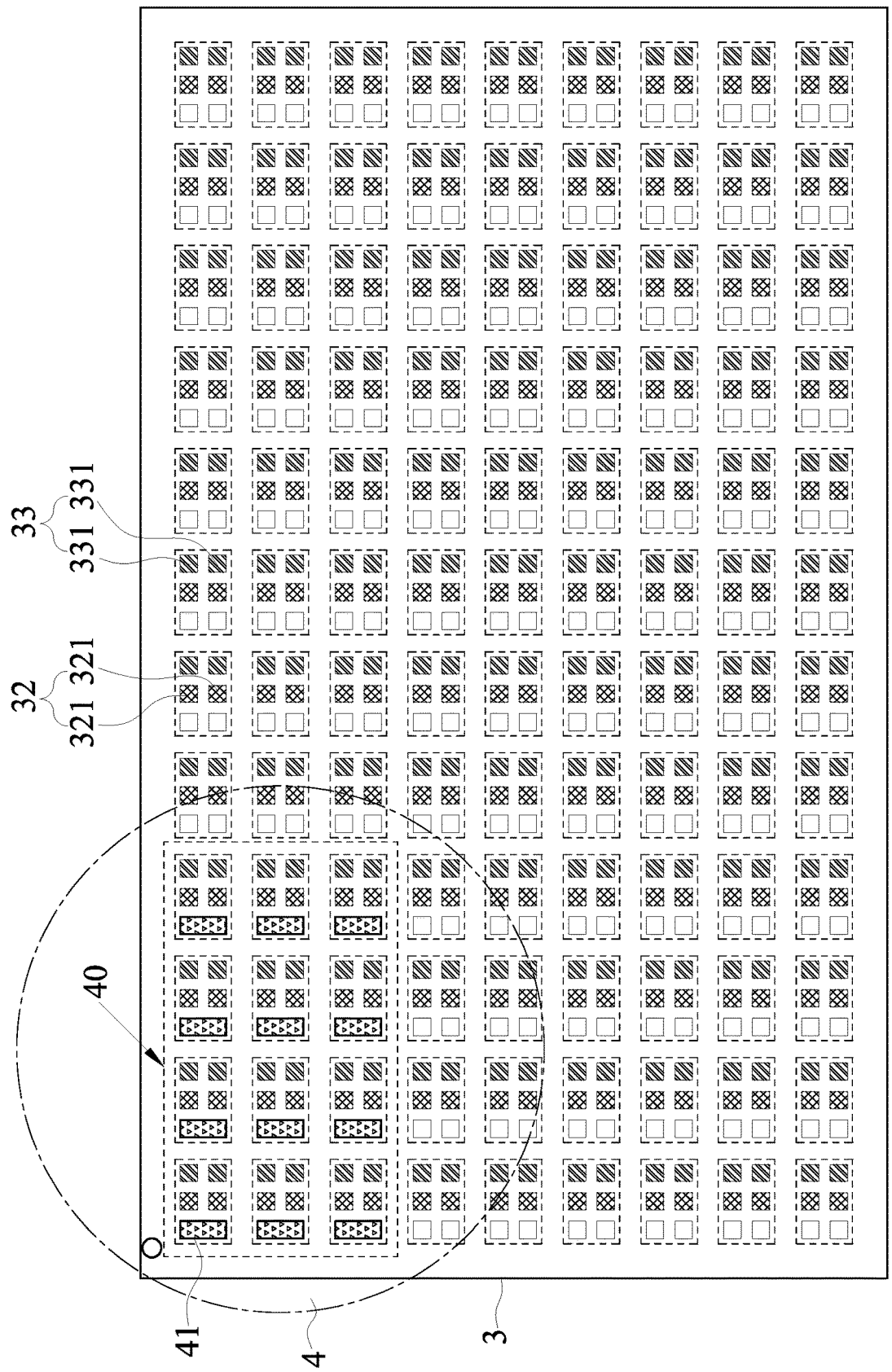
FIG. 4 is a first schematic view showing a chip transfer and fixation in accordance with the first embodiment of this disclosure.

Alternatively, all of the first micro light emitting chips 41 are transferred and fixed to the optical element carrier 3 first, so that all of the first solder portions 31 have the first micro light emitting chips 41, and then all of the second micro light emitting chips 42 are transferred and fixed to the optical element carrier 3, and finally all of the third micro light emitting chips 43 are transferred and fixed to the optical element carrier 3. In other words, the process substrates 4 having the first micro light emitting chips 41 are processed according to the aforementioned procedure, so that all of the first solder portions 41 on the optical element carrier 3 have the first micro light emitting chips 41. Then, the process substrates 4 having the second micro light emitting chips 42 are processed according to the aforementioned procedure, so that all of the second solder portions 32 on the optical element carrier 3 have the second micro light emitting chips 42. Finally, the process substrates 4 having the third micro light emitting chips 43 are processed according to the aforementioned procedure, so that all of the third solder portions 33 on the optical element carrier 3 have the third micro light emitting chips 43, to manufacture the micro LED panel 9 as shown in FIG. 7. In FIGS. 4 to 6, FIG. 4 shows a status of the first micro light emitting chips 41 being transferred and fixed, and FIG. 5 shows a status of the first micro light emitting chips 41 already transferred and fixed to the optical element carrier 3 and then the second micro light emitting chips 42 being transferred and fixed to the optical element carrier 3. After the process substrate 4 originally carrying the second micro light emitting chips 42 is removed, the process substrate 4 with the third micro light emitting chips 43 may be covered onto this area in order to transfer the third micro light emitting chips 43 to the optical element carrier 3 as shown in FIG. 6. Of course, an area can be used as a basis for the transferring and fixing procedure. In other words, a certain area of the optical element carrier 3 (such as the area at the upper left corner of the optical element carrier) is installed with all of the first micro light emitting chips 41, the second micro light emitting chips 42 and the third micro light emitting chips 43 first, and then another area of the optical element carrier 3 are processed with the transferring operation.

To facilitate transferring the first micro light emitting chips 41, the second micro light emitting chips 42 and the third micro light emitting chips 43 to the optical element carrier 3 quickly and accurately, a preferred embodiment is adopted, wherein the optical element carrier 3 has a first positioning portion 34 at a position on the optical element carrier 3 not defined by the pixel regions 30; at least one of the process substrates 4 has a second positioning portion 44, and the first positioning portion 34 and the second positioning portion 44 are configured to be corresponsive to each other to confirm the transferring and fixing position to facilitate transferring and fixing the first micro light emitting chips 41, the second micro light emitting chips 42 or the third micro light emitting chips 43 to the optical element carrier 3 at a time. When the first micro light emitting chips 41, the second micro light emitting chips 42 or the third micro light emitting chips 43 are transferred and fixed, the corresponsive configuration of the first positioning portion 34 and the second positioning portion 44 achieves the alignment effect, sot that the first micro light emitting chips 41, the second micro light emitting chips 42 and the third micro light emitting chips 43 can be transferred and fixed to the optical element carrier 3 accurately. In FIGS. 2 to 6, we can observe that the optical element carrier 3 has the first positioning portion 34, and the process substrate 4 having the first micro light emitting chips 41, the second micro light emitting chips 42 or the third micro light emitting chips 43 formed thereon has the second positioning portion 44, so that when the process substrate 4 is covered onto the optical element carrier 3, the first positioning portion 34 and the second positioning portion 44 are configured to be corresponsive to each other to confirm whether or not the first micro light emitting chips 41 are aligned with the first solder portions 31, whether or not the second micro light emitting chips 42 are aligned with the second solder portions 32, and whether or not the third micro light emitting chips 43 is aligned with the third solder portions 33. In an embodiment, if the optical element carrier 3 needs to correspond to a plurality of process substrates 4 having the first micro light emitting chips 41, the second micro light emitting chips 42 and the third micro light emitting chips 43 formed thereon, then the optical element carrier 3 will have a plurality of first positioning portions 34 at positions not defined by the pixel regions 30, and each of the process substrates 4 has the second positioning portion 34, so as to achieve the accurate aligning, transferring, and fixing effects.

When the optical element carrier 3 already has some of the first micro light emitting chips 41, the second micro light emitting chips 42 or the third micro light emitting chips 43 which are transferred and fixed the process substrate 4, any one of the first micro light emitting chips 41, the second micro light emitting chips 42 or the third micro light emitting chips 43 is used as a positioning point to confirm the transferring and fixing position. As long as some of the first micro light emitting chips 41, the second micro light emitting chips 42 or the third micro light emitting chips 43 have been transferred to the optical element carrier 3, these chips may be used as a positioning point to confirm the subsequent transferring and fixing position of each process substrate 4, so as to reduce the number of setting the positioning structure and improve the convenience of alignment.

Figure 8:
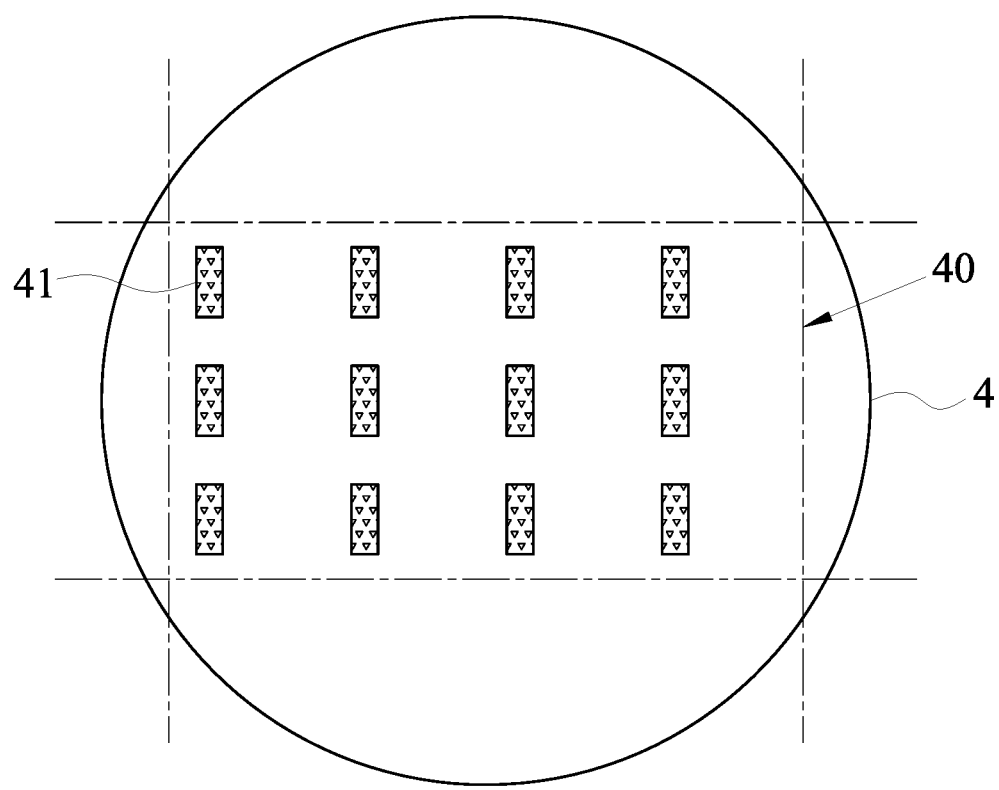
FIG. 8 is a schematic view of cutting a process substrate in accordance with the first embodiment of this disclosure.
Figure 9:
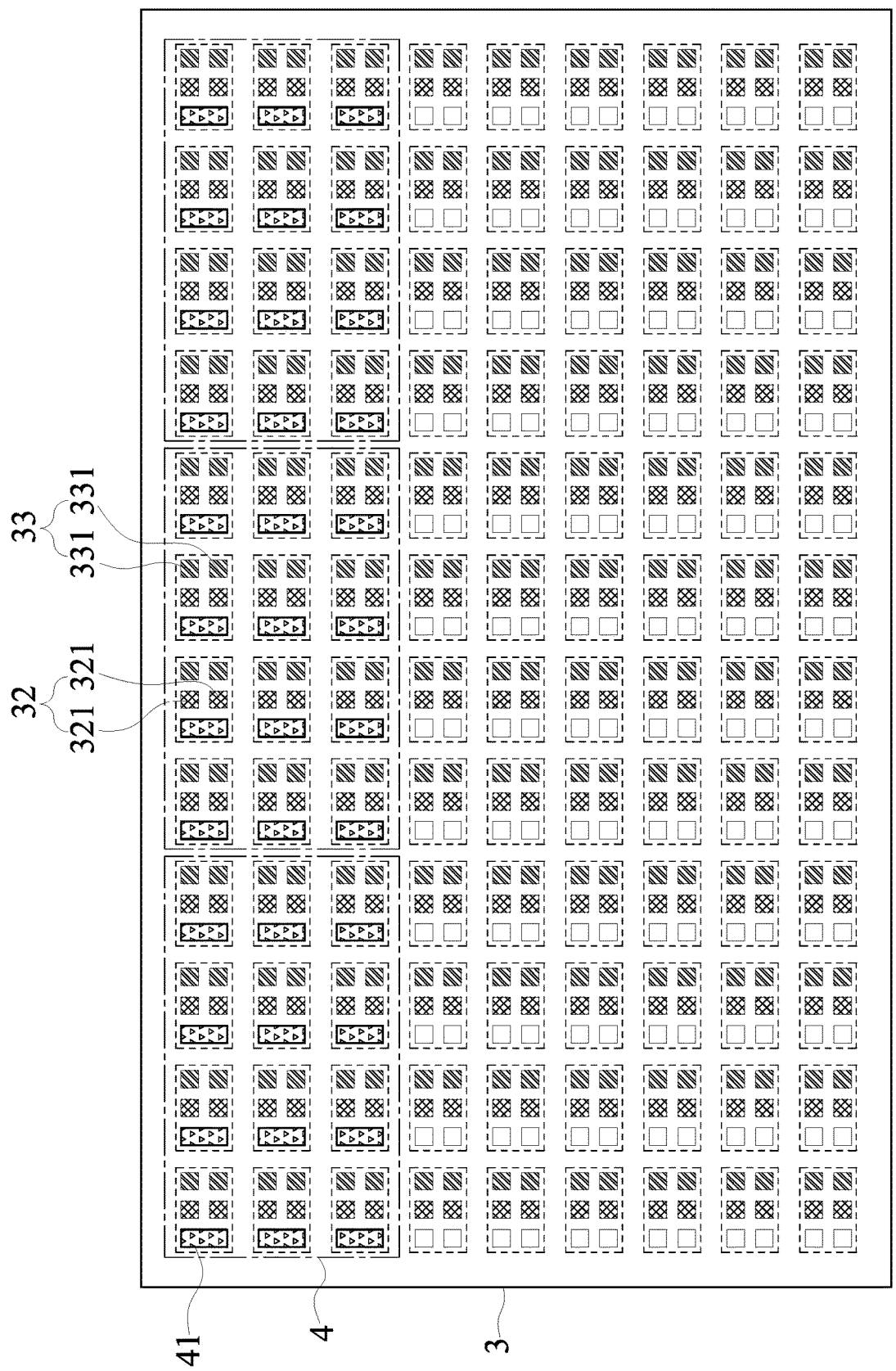
FIG. 9 is a schematic view of a chip transfer after cutting a process substrate in accordance with the first embodiment of this disclosure.

In addition to the aforementioned positioning method, the process substrates 4 are cut before the first micro light emitting chips 41, the second micro light emitting chips 42 or the third micro light emitting chips 43 are transferred and fixed, wherein each process substrate 4 is cut along the edge of the process area 40 into a shape corresponding to the process area 40. With reference to FIGS. 8 and 9 for the schematic views of cutting a process substrate and transferring a chip after the process substrate is cut in accordance with this disclosure respectively, the process substrates 4 are cut along the process area 40 before they are transferred, and then each process substrate 2 with chips of the same light color is covered onto the optical element carrier 3 during the chip transfer. For example, the process substrates 4 with the first micro light emitting chips 41 are arranged sequentially, and then the first micro light emitting chips 41 are transferred to the first solder portions 31 as shown in FIG. 9, so as to achieve the effects of positioning the process substrates 4 and expediting the transfer and fixing of the chips. The process substrates 4 having the second micro light emitting chips 42 and the third micro light emitting chips 43 formed thereon may be cut and transferred according to this method.

This disclosure further discloses a micro LED panel 9 manufactured by the aforementioned manufacturing method. The specific structure of the micro LED panel 9 is described below and illustrated in FIG. 7. The micro LED panel 9 comprises the optical element carrier 3, the first solder portions 31, the second solder portions 32, the third solder portions 33, the first micro light emitting chips 41, the second micro light emitting chips 42 and the third micro light emitting chips 43. The optical element carrier 3 has a plurality of pixel regions 30 arranged substantially into a matrix, and the first solder portions 31, the second solder portions 32 and the third solder portions 33 are disposed in each pixel region 30, and each second solder portion 32 is situated on a side of each first solder portion 31, and each third solder portion 33 is situated on a side of the first solder portion 31 or the second solder portion 32. Each first micro light emitting chip 41 is soldered onto each respective first solder portion 31, each second micro light emitting chip 42 is soldered onto each respective second solder portion 32, and each third micro light emitting chip 43 is soldered onto each respective third solder portion 33, wherein the light colors of the first micro light emitting chips 41, the second micro light emitting chips 42 and the third micro light emitting chips 43 are different from each other, so that each pixel region 30 emits a white light. In addition, the structural changes and technical characteristics of the micro LED panel 9 have been described in details above, and illustrated in the related drawings, and thus they will not be repeated. The micro LED panel 9 manufactured by the aforementioned method with highly efficient and highly accurate formation and transfer procedures has the features of excellent light output performance, color rendering, etc., and the micro LED panel 9 has a high yield and a good application effect.

Figure 10:
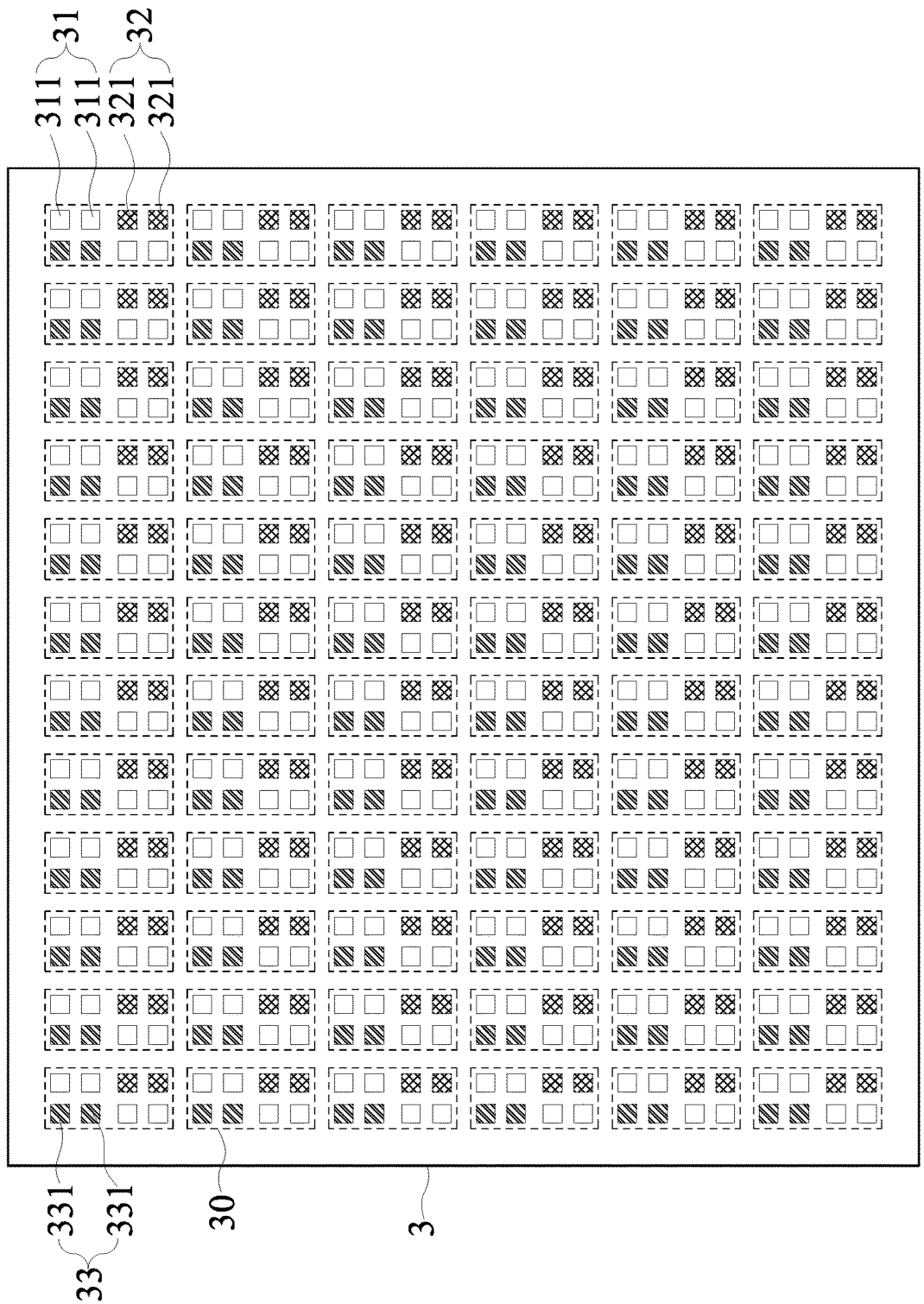
FIG. 10 is a schematic view of an optical element carrier in accordance with another implementation mode of the first embodiment of this disclosure.
Figure 11:
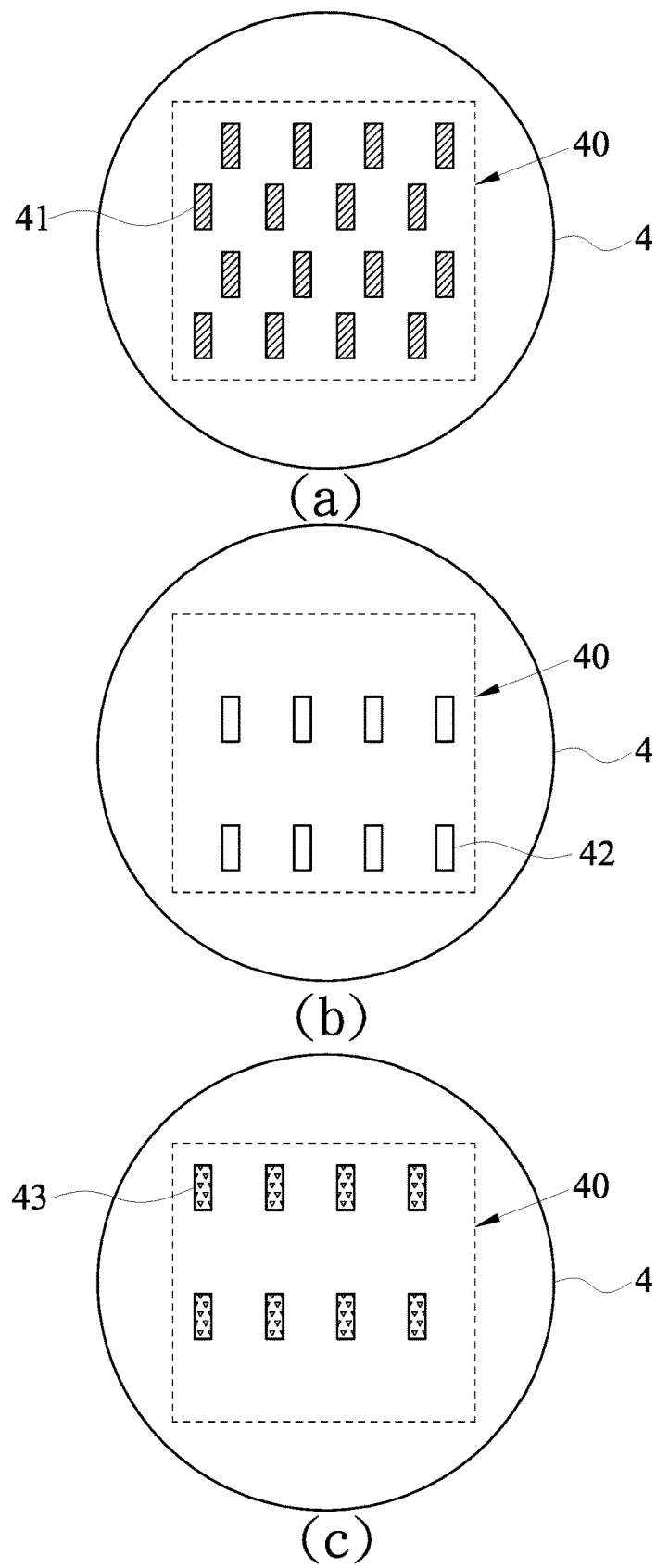
FIG. 11 is a schematic view of a process substrate in accordance with another implementation mode of the first embodiment of this disclosure.
Figure 12:
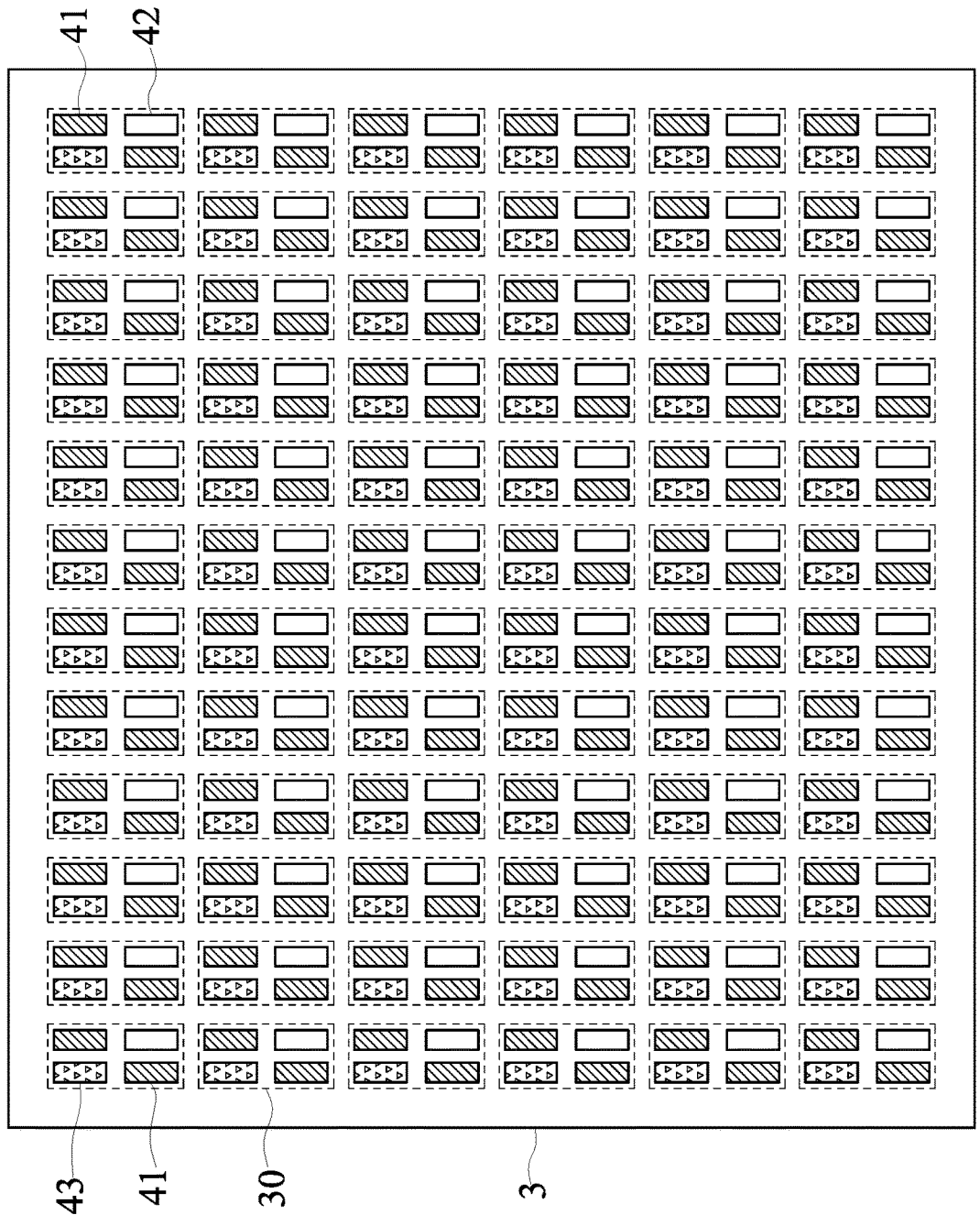
FIG. 12 is a schematic view of a micro LED panel in accordance with another implementation mode of the first embodiment of this disclosure.

With reference to FIGS. 10 to 12 for the schematic views of an optical element carrier, a process substrate and a micro LED panel in accordance with another implementation mode of the first embodiment of this disclosure respectively, each pixel region 30 has two of the first solder portions 31, one second solder portion 32 and one third solder portion 33, wherein the first solder portions 31, the second solder portion 32 and the third solder portion 33 are arranged into a 2×2 matrix, and the first solder portions 31 are arranged diagonally with respect to each other. Preferably, the light color of the first micro light emitting chips 41 is a green color, the light color of the second micro light emitting chips 42 is a blue color, and the light color of the third micro light emitting chips 43 is a red color. The output light color of each pixel region 30 may be adjusted to meet the white light requirement. However, such position and light color are just used as an example for the purpose of illustrating this disclosure only, but not intended for limiting the scope of this disclosure.

In the aforementioned layout of the solder portions, the first process mode, the second process mode and the third process mode may be set, so that the first micro light emitting chips 41, the second micro light emitting chips 42 and the third micro light emitting chips 43 can be formed in the process area 40 of the process substrates 4 according to the positions of the first solder portions 31, the second solder portions 32 and the third solder portions 33 as shown in FIG. 11, wherein FIG. 11 (a) is a schematic view showing that the first micro light emitting chips 41 are formed in the process area 40 of the process substrate 4 and configured to be corresponsive to the first solder portions 31, FIG. 11(b) is a schematic view showing that the second micro light emitting chips 42 are formed in the process area 40 of the process substrate 4 and configured to be corresponsive to the second solder portions 32, and FIG. 11(c) is a schematic view showing that the third micro light emitting chips 43 are formed in the process area 40 of the process substrate 4 and configured to be corresponsive to the third solder portions 33. After each process substrate 4 has the first micro light emitting chips 41, the second micro light emitting chips 42 and the third micro light emitting chips 43 formed thereon, the transferring and fixing procedure is carried out to transfer and fix the first micro light emitting chips 41, the second micro light emitting chips 42 and the third micro light emitting chips 43 on the process substrates 4 to the optical element carrier 3 at a time, so as to manufacture the micro LED panel 9 as shown in FIG. 12.

Figure 13:
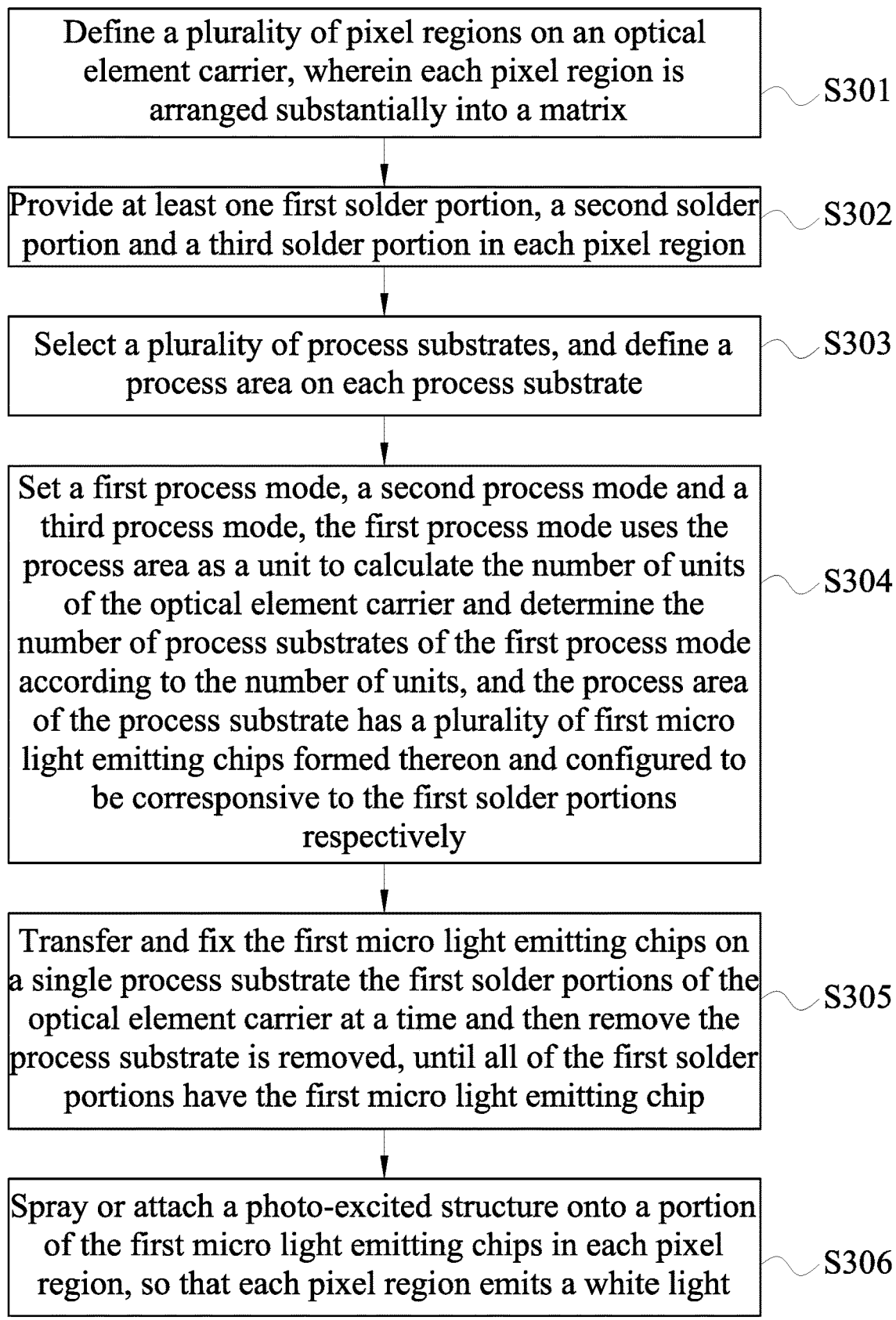
FIG. 13 is a flow chart of a method for manufacturing a micro LED panel in accordance with a second embodiment of this disclosure.
Figure 14:
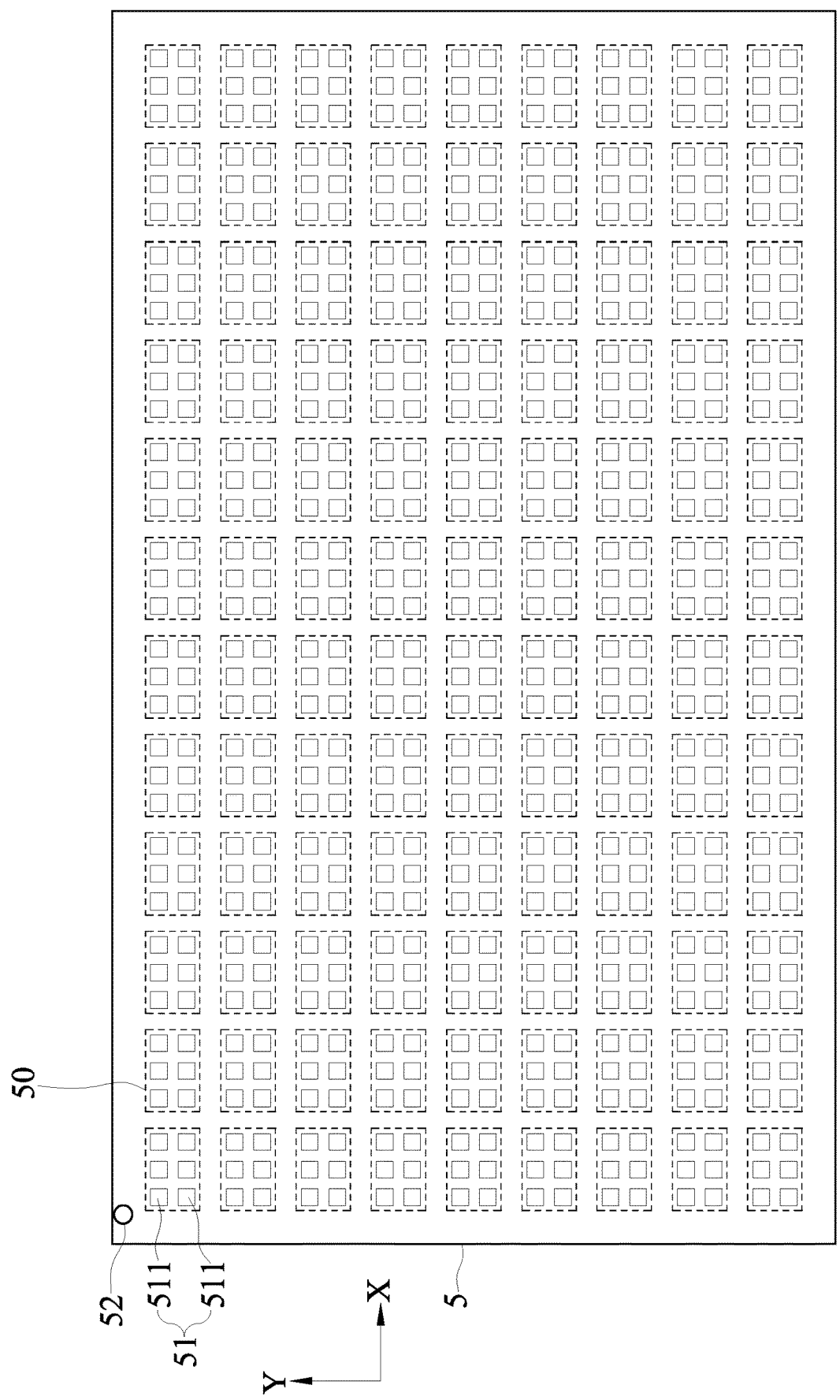
FIG. 14 is a schematic view of an optical element carrier in accordance with the second embodiment of this disclosure.
Figure 15:
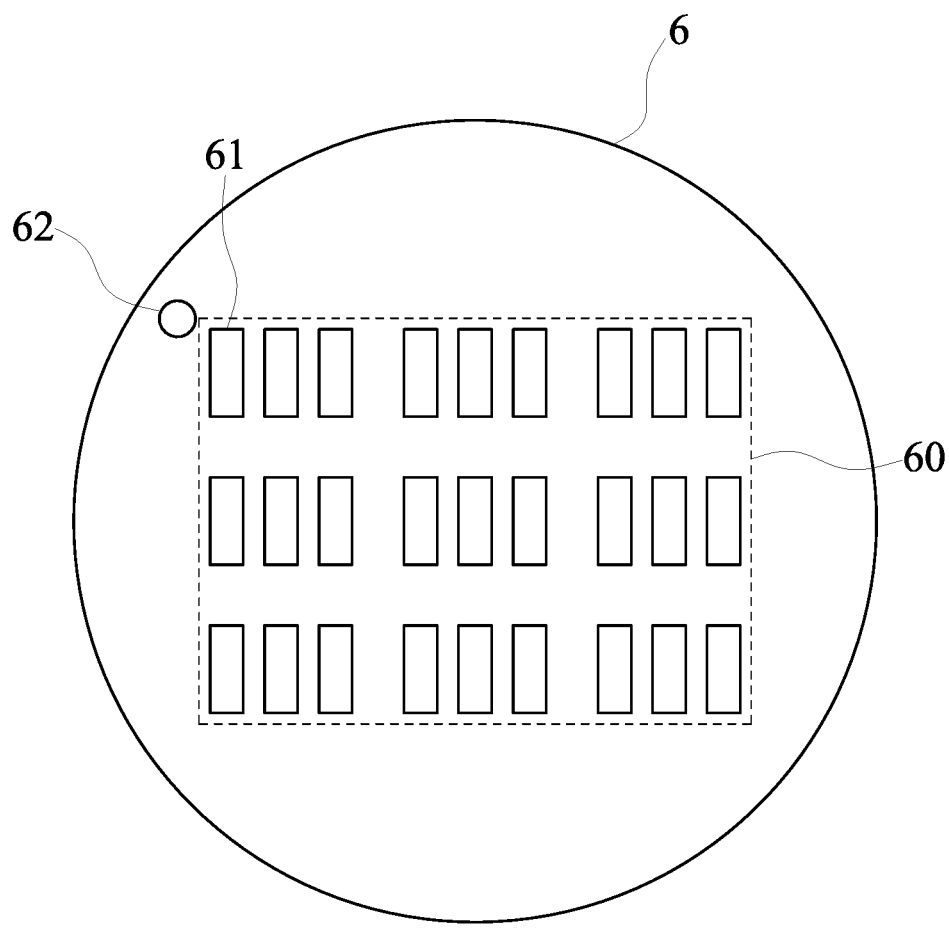
FIG. 15 is a schematic view of a process substrate in accordance with the second embodiment of this disclosure.
Figure 16:
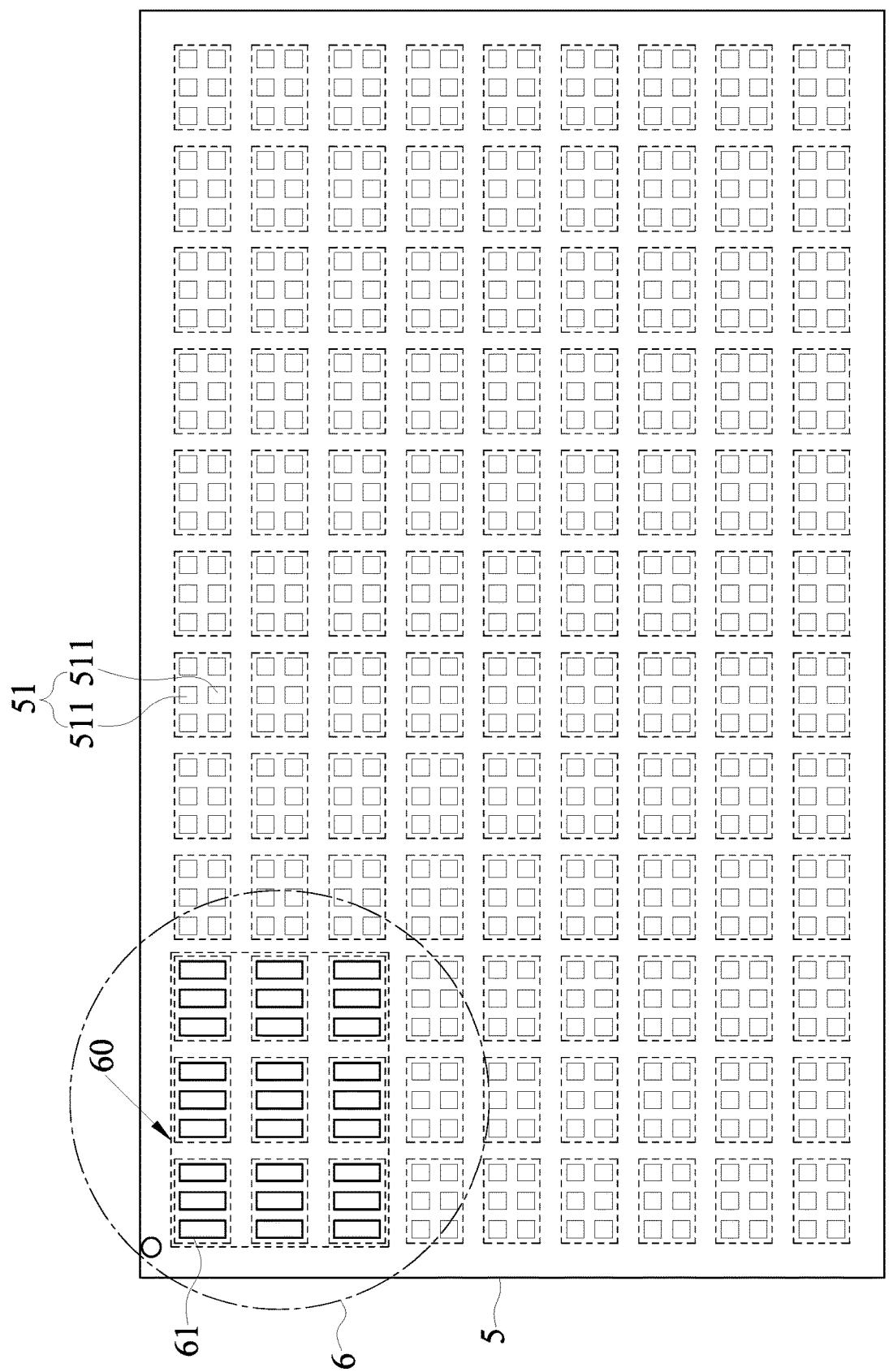
FIG. 16 is a schematic view of an optical element carrier after transferring and fixing a chip in accordance with the second embodiment of this disclosure.

With reference to FIGS. 13 and 14 for the flow chart of the manufacturing method of a micro LED panel and a schematic view of an optical element carrier in accordance with the second embodiment of this disclosure respectively, the method for manufacturing a micro LED panel comprises following steps:

S301: Define a plurality of pixel regions 50 on an optical element carrier 5, wherein each pixel region 50 is arranged substantially into a matrix arrangement.

S302: Provide a plurality of first solder portions 51 in each pixel region 50. Preferably, each pixel region 50 has at least three of the first solder portions 51 therein to meet the light emission requirement of the micro LED panel 10. Now, the first solder portions 51 in each pixel region 50 are arranged along the X-axis direction or the Y-axis direction to form a 1×3 matrix, and each first solder portion 51 has two first solder joints 511, and the first solder portions 51 of this embodiment are arranged along the X-axis direction to form a 1×3 matrix.

S303: Select a plurality of process substrates 6 and define a process area 60 on each process substrate 6, wherein the type of process substrates used in this step is selected to facilitate the subsequent manufacturing process of forming the chips.

S304: Set a first process mode, wherein the selected first process mode uses the process area 60 as a unit to calculate the number of units of the optical element carrier 5, and then determine the number of process substrates of the first process mode according to the number of units, and the process area 60 of the process substrate 6 has a plurality of first micro light emitting chips 61 formed thereon and configured to be corresponsive to the first solder portions 51. For the manufacture of this disclosure, the conditions including the configuration of the pixel regions 50 defined on the optical element carrier 5, the first solder portions 51 of the pixel regions 50, and the selected type of the process substrate 6 are used to confirm the number of process substrates of the first process mode, and then the position and number of the first micro light emitting chips 61 formed in each process area 50 are set according to the position of the first solder portions 51. After the first micro light emitting chips 61 are formed.

S305: Transfer and fix the first micro light emitting chips 61 on the single the process substrate 6 to the first solder portions 51 of the optical element carrier 5 at a time and then remove the process substrate 6, until all of the first solder portions 51 have the first micro light emitting chip 61. Since the first micro light emitting chips 61 are formed by the first process mode, therefore the chips are configured to be corresponsive to the solder portions already before the chips are transferred and fixed, and all of the first micro light emitting chips 61 on the single the process substrate 6 are transferred to the first solder portions 51 at a time, so as to reduce the transfer difficulty and time, while improving the chip alignment precision significantly.

Similarly, the process substrates 6 are cut before the first micro light emitting chips 61 are transferred and fixed, and each process substrate 6 is cut along an edge of the process area into a shape corresponding to the process area, so as to achieve the alignment effect when the chips are transferred and fixed, and several process substrates 6 can be arranged at the same time for the transferring and fixing operations. Wherein, the status of the process substrates and the status of transferring and fixing the chips are shown in FIGS. 8 and 9.

Alternatively, the optical element carrier 5 has a first positioning portion 52 disposed at a position not defined by the pixel regions 50; at least one process substrate 6 has a second positioning portion 62, so that when the first micro light emitting chips 61 are transferred and fixed to the optical element carrier 5, the first positioning portion 51 and the second positioning portion 62 are configured to be corresponsive to each other to confirm the transferring and fixing position. The structures of the first positioning portion 52 and the second positioning portion 62 can be used to achieve the alignment effect when the first micro light emitting chips 61 are transferred and fixed to the optical element carrier 5, so as to prevent deviations occurred when the first micro light emitting chips 61 are transferred and fixed and prevent affecting the overall product yield. In addition, when the optical element carrier 5 already has some of the first micro light emitting chips 61 and the process substrate 6 is transferred and fixed, any one of the first micro light emitting chips 61 may be used as a positioning point to confirm the transferring and fixing position. Therefore, the number of the first positioning portions 52 and the second positioning portions 62 can be reduced, while maintaining the aligning, transferring, and fixing effects effectively and accurately.

Spray or attach a photo-excited structure 7 to some of the first micro light emitting chips 61 of each pixel region 50 after all of the first solder portions 51 have the first micro light emitting chips 61, so that each pixel region 50 emits a white light. Preferably, the light color of the first micro light emitting chips 61 is a blue color, and the light color of the first micro light emitting chip 61 after being sprayed or attached with the photo-excited structure 7 is a green color or a red color. Wherein, the photo-excited structure 7 may be phosphor or quantum dot to facilitate producing the output light color of the first micro light emitting chip 61 sprayed and attached with the photo-excited structure in the required color under the effect of the photo-excited structure 7. For example, two of the first micro light emitting chips 61 are sprayed or attached with the photo-excited structure 7 in each pixel region 50, and the first micro light emitting chip 61 situated at the leftmost side of each pixel region 50 and sprayed or attached with the photo-excited structure 7 emits a red light, and the first micro light emitting chip 61 situated at the middle of each pixel region 50 and sprayed or attached with the photo-excited structure 7 emits a green light. When the first micro light emitting chips 61 are formed, they can be formed by batch according to the position of the chips sprayed or attached with the photo-excited structure 7. For example, when the first micro light emitting chips 61 are formed in the process area of any one of the process substrate 6 which is configured to be corresponsive to the first solder portions 51 not subsequently sprayed or attached with the photo-excited structure 7, the first micro light emitting chips 61 are formed in the process area 60 of another process substrate 6 which is configured to be corresponsive to the first solder portions 51 subsequently sprayed or attached with the photo-excited structure 7.

Figure 17:
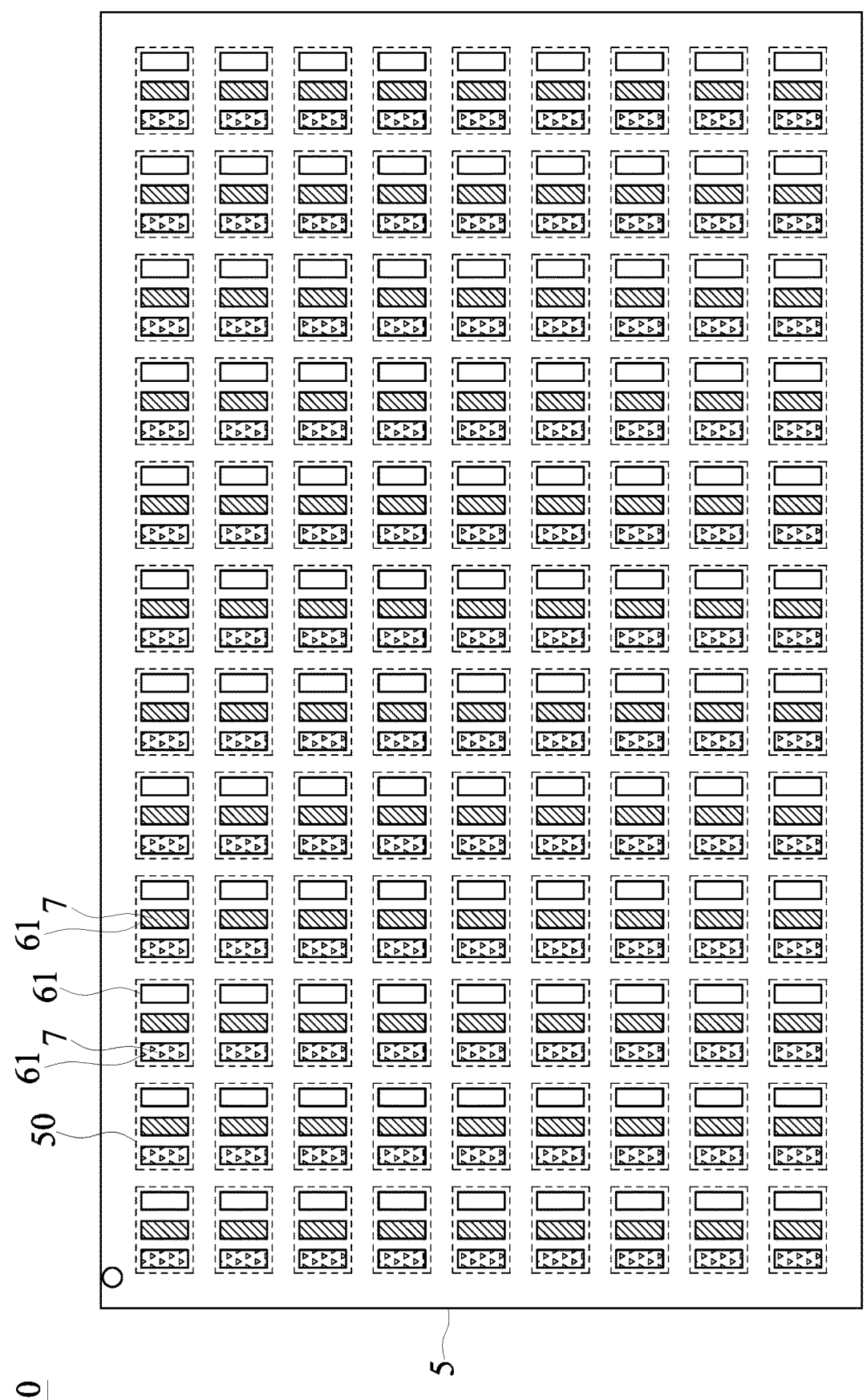
FIG. 17 is a schematic view of a micro LED panel in accordance with the second embodiment of this disclosure.

This disclosure further discloses a micro LED panel 10 manufactured by the aforementioned manufacturing method, and the specific structure of the micro LED panel 10 is described below and illustrated in FIG. 17. The micro LED panel 10 comprises the optical element carrier 5, the first solder portions 51, the first micro light emitting chips 61 and the photo-excited structures 7. The optical element carrier 5 has a plurality of pixel regions 50 arranged substantially into a matrix, and the first solder portions 31 are disposed in each pixel region 30, and each first micro light emitting chip 61 is soldered onto each respective first solder portion 51, and the photo-excited structures 7 is sprayed or attached to at least one of the first micro light emitting chips 61 in each pixel region 50, so that each pixel region 50 emits a white light. In addition, the structural changes and technical characteristics of the micro LED panel 10 have been described in details above, and illustrated in the related drawings, and thus they will not be repeated. The micro LED panel 10 manufactured by the aforementioned method has an excellent chip transferring and fixing effect, and features the excellent light output effect and a better quality of the application by reducing the deviation of the chips greatly.

Figure 18:
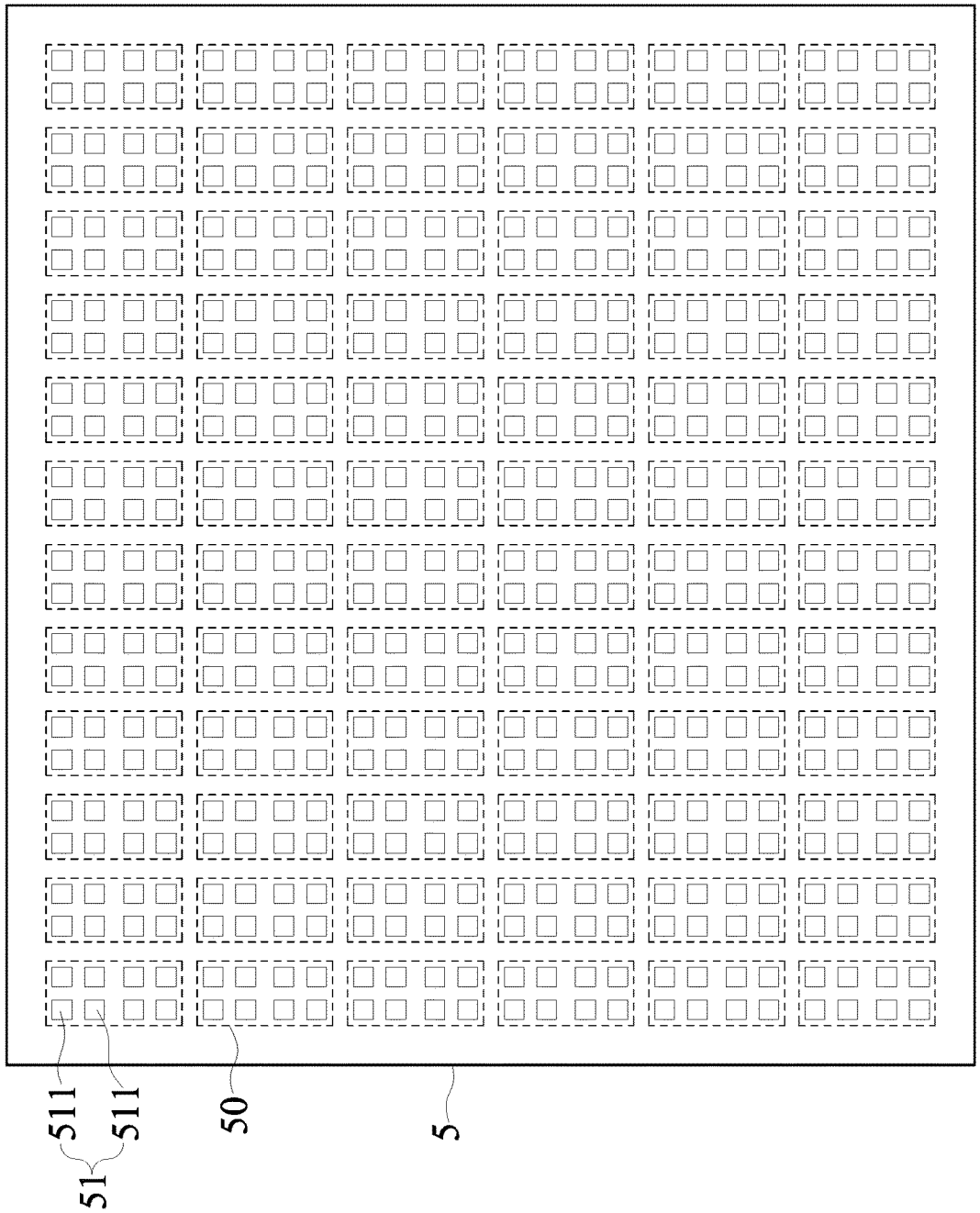
FIG. 18 is a schematic view of an optical element carrier in accordance with another implementation mode of the second embodiment of this disclosure.
Figure 19:
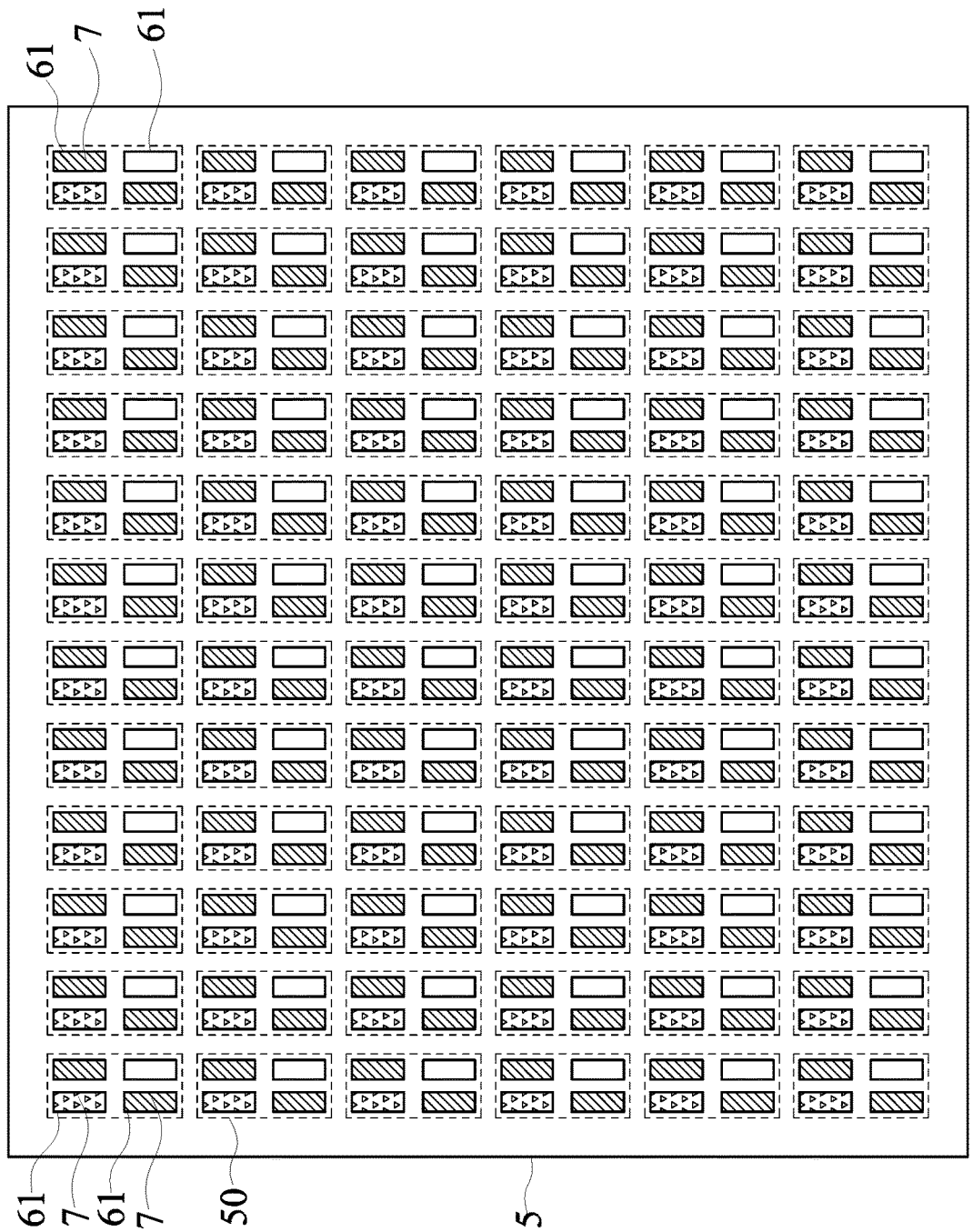
FIG. 19 is a schematic view of a micro LED panel in accordance with another implementation mode of the second embodiment of this disclosure.

With reference to FIGS. 18 and 19 for the schematic views of an optical element carrier and a micro LED panel in accordance with another implementation mode of the second embodiment of this disclosure respectively, each pixel region 50 has four of the first solder portion 51 arranged into a 2×2 matrix, and each first solder portion 51 has two first solder joints 511. This implementation mode discloses another layout of the first solder portions 51 of each pixel region 50, wherein the first solder portions 51 have the two first solder joints 511 in this embodiment. In the optical element carrier 5 of this implementation mode, if it is necessary to form the first micro light emitting chips 61 on the process substrates 6, then the process substrate 6 will be configured to be corresponsive to different positions of the first solder portions 51. For example, the first micro light emitting chips 61 on one of the process substrates 6 are formed by the first solder portion 51 situated at the upper left corner of each pixel region 50, and the first micro light emitting chips 61 of one of the process substrates 6 are formed by the first solder portion 51 situated at the upper right corner in each pixel region 50, and the first micro light emitting chips 61 on one of the process substrates 6 are formed by the first solder portions 51 situated at the lower right corner and the lower left corner in each pixel region 50.

In the transferring and fixing procedure, the process substrates 6 are also cut before the first micro light emitting chips 61 are transferred and fixed, wherein each process substrate 6 is cult along the edge of the process area 60 into a shape corresponding to the process area 60, or the optical element carrier 5 has a first positioning portion 52 disposed at a position not defined by the pixel regions 50; at least one of the process substrates 6 has a second positioning portion 62, and the first positioning portion 52 and the second positioning portion 62 are configured to be corresponsive to each other to confirm the transferring and fixing position to facilitate transferring and fixing the first micro light emitting chips 61 to the optical element carrier 5, so as to improve the transferring and fixing precision. When the optical element carrier 5 already has some of the first micro light emitting chips 61 and the process substrate 6 is transferred and fixed, any one of the first micro light emitting chips 61 is used as a positioning point to confirm the transferring and fixing position, so as to reduce the level of difficulty of the alignment and expedite the manufacturing speed. The details of the remaining technical characteristics have been described above, and thus will not be repeated.

In a preferred embodiment, the light color of the first micro light emitting chips 61 is a blue color, the light color of the first micro light emitting chips 61 after being sprayed or attached with the photo-excited structure 7 is a green color or a red color, and the light color of at least two of the first micro light emitting chips 61 in each pixel region 50 after being sprayed or attached with the photo-excited structure 7 is a green color and the at least two first micro light emitting chips are arranged diagonally with respect to each other in order to provide a more accurate output light color of the pixel regions 50 and meet the requirements. The micro LED panel 10 as shown in FIG. 19 can be manufactured by the aforementioned manufacturing method. Specifically, the first micro light emitting chips 61 arranged diagonally with respect to each other in each pixel region 50 are sprayed or attached with the photo-excited structure 7 as shown in FIG. 19 to emit a green light, and the first micro light emitting chip 61 at the upper left corner of each pixel region 50 is also sprayed or attached with the photo-excited structure 7 to emit a red light. However, such position and light color configuration are used as a preferred embodiment, but this disclosure is not limited to such arrangement.

In summation of the description above, the method for manufacturing a micro LED panel and a product manufactured thereof in accordance with this disclosure use a novel manufacturing process to manufacture the products that use a micro LED as a light source to overcome the inconvenience of the conventional manufacturing process. In this disclosure, the status of installing the formed chip is used as a basis to calculate the number and position of the chips required to be transferred and fixed onto the process substrate, and then all of the chips on the single process substrate are transferred and fixed onto the optical element carrier at a time, so as to assure the accuracy of the transferring and fixing position of the chips and achieve the effects of preventing deviations of the light emitting areas, and transferring and fixing all chips at a time to simplify the factors of controlling the manufacturing process and reduce the inconvenience, so that it is not necessary to determine the sequence of separating each chip during the transferring and fixing process. For a very small size of the micro LED, if it is necessary to set the sequence of transferring the micro Led chips onto the optical element carrier one by one during the transferring process, then it will delay the manufacturing process and cause low transfer efficiency and deviations of the transferring position. In other words, the conventional manufacturing method of the micro LED related products do not make adjustments or set configurations according to the chip position of the final product for forming the micro LED chips. In general, a largest possible number of chips are formed on the process substrate, but there is no technical concept of configuring the formation position. On the other hand, the formation of the micro LED chips is closely associated with the chip configuration of the final product in this disclosure, and factors such as subsequent transfer convenience, transfer speed and transfer accuracy are taken into consideration for the formation of the chips, so that the products so manufactured have an excellent light output performance and improved product yield and quality.

What is claimed is:

1. A method for manufacturing a micro LED panel, comprising the steps of:
   defining a plurality of pixel regions on an optical element carrier, each being arranged substantially into a matrix;
   providing at least one first solder portion, at least one second solder portion and at least one third solder portion in each pixel region;
   selecting a plurality of process substrates, and defining a process area on each of the plurality of process substrates;
   setting a first process mode, a second process mode and a third process mode, wherein the first process mode uses the process area as a unit to calculate a number of units of the optical element carrier and determine a number of process substrates of the first process mode according to the number of units, and the process area of a corresponding process substrate has a plurality of first micro light emitting chips formed thereon and configured to be corresponsive to the at least one first solder portion respectively; the second process mode also uses the process area as a unit to calculate a number of units of the optical element carrier and determine a number of process substrates of the second process mode according to the number of units, and the process area of a corresponding process substrate has a plurality of second micro light emitting chips formed thereon and configured to be corresponsive to the at least one second solder portion respectively; the third process mode also uses the process area as a unit to calculate a number of units of the optical element carrier and determine a number of process substrates of the third process mode according to the number of units, and the process area of a corresponding process substrate has a plurality of third micro light emitting chips formed thereon and configured to be corresponsive to the at least one third solder portion respectively; the plurality of first micro light emitting chips, the plurality of second micro light emitting chips and the plurality of third micro light emitting chips have light colors different from each other; and the plurality of first micro light emitting chips on a single first process substrate are transferred and fixed to the at least one first solder portion of the optical element carrier at a time and then the first process substrate is removed; the plurality of second micro light emitting chips on a single second process substrate are transferred and fixed to the at least one second solder portion of the optical element carrier at a time and then the second process substrate is removed; and the plurality of third micro light emitting chips on a single third process substrate are transferred and fixed to the at least one third solder portion of the optical element carrier at a time and then the third process substrate is removed, until all of the at least one first solder portion have the plurality of first micro light emitting chips, and all of the at least one second solder portion have the plurality of second micro light emitting chips, and all of the at least one third solder portion have the plurality of third micro light emitting chips, so that each pixel region emits a white light.

2. The method for manufacturing a micro LED panel as claimed in claim 1, wherein the at least one first solder portion, the at least one second solder portion and the at least one third solder portion in each pixel region are arranged along an X-axis direction or a Y-axis direction to form a 1×3 matrix; each first solder portion has two first solder joints; each second solder portion has two second solder joints; and each third solder portion has two third solder joints.

3. The method for manufacturing a micro LED panel as claimed in claim 2, wherein the plurality of process substrates are cut before the plurality of first micro light emitting chips or the plurality of second micro light emitting chips are transferred and fixed, and each of the plurality of process substrates is cut along an edge of the process area into a shape corresponding to the process area.

4. The method for manufacturing a micro LED panel as claimed in claim 2, wherein the optical element carrier has a first positioning portion situated at a position not defined by the plurality of pixel regions; and at least one of the plurality of process substrates has a second positioning portion provided for configuring the first positioning portion to be corresponsive to the second positioning portion in order to confirm a transferring and fixing position when the plurality of first micro light emitting chips, the plurality of second micro light emitting chips or the plurality of third micro light emitting chips are transferred and fixed to the optical element carrier.

5. The method for manufacturing a micro LED panel as claimed in claim 4, wherein when the optical element carrier already has some of the plurality of first micro light emitting chips, the plurality of second micro light emitting chips or the plurality of third micro light emitting chips installed thereon and the plurality of process substrates are transferred and fixed, any one of the plurality of first micro light emitting chips, the plurality of second micro light emitting chips or the plurality of third micro light emitting chips is used as a positioning point to confirm the transferring and fixing position.

6. The method for manufacturing a micro LED panel as claimed in claim 5, wherein a light color of the plurality of first micro light emitting chips is red color, a light color of the plurality of second micro light emitting chips is green color, and a light color of the plurality of third micro light emitting chips is blue color.

7. The method for manufacturing a micro LED panel as claimed in claim 1, wherein each pixel region has two first solder portions, one second solder portion and one third solder portion disposed therein, and the two first solder portions, the one second solder portion and the one third solder portion are arranged into a 2×2 matrix, and the two first solder portions are diagonally arranged with respect to each other.

8. The method for manufacturing a micro LED panel as claimed in claim 7, wherein the plurality of process substrates is cut before the plurality of first micro light emitting chips or the plurality of second micro light emitting chips are transferred and fixed, and each of the plurality of process substrates is cut along an edge of the process area into a shape corresponding to the process area.

9. The method for manufacturing a micro LED panel as claimed in claim 7, wherein the optical element carrier has a first positioning portion situated at a position not defined by the plurality of pixel regions; and at least one of the process substrates has a second positioning portion provided for configuring the first positioning portion to be corresponsive to the second positioning portion in order to confirm a transferring and fixing position when the plurality of first micro light emitting chips, the plurality of second micro light emitting chips or the plurality of third micro light emitting chips are transferred and fixed to the optical element carrier.

10. The method for manufacturing a micro LED panel as claimed in claim 9, wherein the plurality of process substrates are transferred and fixed when the optical element carrier already has some of the plurality of first micro light emitting chips, the plurality of second micro light emitting chips or the plurality of third micro light emitting chips installed thereon, and any one of the plurality of first micro light emitting chips or the plurality of second micro light emitting chips is used as a positioning point to confirm the transferring and fixing position.

11. The method for manufacturing a micro LED panel as claimed in claim 10, wherein a light color of the plurality of first micro light emitting chips is a green color, a light color of the plurality of second micro light emitting chips is a blue color, and a light color of the plurality of third micro light emitting chips is a red color.

12. A micro LED panel manufactured by the manufacturing method as claimed in claim 1, comprising:

an optical element carrier, having a plurality of pixel regions defined therein, and each pixel region being arranged substantially into a matrix;
a plurality of first solder portions, disposed in the plurality of pixel regions respectively;
a plurality of second solder portions, disposed in the plurality of pixel regions respectively, and situated on a side of the plurality of first solder portions;
a plurality of third solder portions, disposed in the plurality of pixel regions respectively and situated on the side of the plurality of first solder portions or on a side of the plurality of second solder portions;
a plurality of first micro light emitting chips, soldered onto the plurality of first solder portions respectively;
a plurality of second micro light emitting chips, soldered onto the plurality of second solder portions respectively; and
a plurality of third micro light emitting chips, soldered onto the plurality of third solder portions respectively; wherein the plurality of first micro light emitting chips, the plurality of second micro light emitting chips and the plurality of third micro light emitting chips have different colors from each other, so that the plurality of pixel regions emit a white light.

13. The micro LED panel as claimed in claim 12, wherein the plurality of first solder portions, the plurality of second solder portions and the plurality of third solder portions in each pixel region are arranged along an X-axis direction or a Y-axis direction to form a 1×3 matrix, and each first solder portion has two first solder joints, and each second solder portion has two second solder joints, and each third solder portion has two third solder joints.

14. The micro LED panel as claimed in claim 13, wherein the optical element carrier has a first positioning portion defined at a position without the plurality of pixel regions; at least one process substrate has a second positioning portion, and the first positioning portion and the second positioning portion are configured to be corresponsive to each other to confirm a transferring and fixing position when the plurality of first micro light emitting chips, the plurality of second micro light emitting chips, or the plurality of third micro light emitting chips are transferred and fixed to the optical element carrier.

15. The micro LED panel as claimed in claim 14, wherein when the optical element carrier already has some of the plurality of first micro light emitting chips, the plurality of second micro light emitting chips or the plurality of third micro light emitting chips, the at least one process substrate is transferred and fixed, and any one of the plurality of first micro light emitting chips, the plurality of second micro light emitting chips or the plurality of third micro light emitting chips is used as a positioning point to confirm the transferring and fixing position.

16. The micro LED panel as claimed in claim 15, wherein a light color of the plurality of first micro light emitting chips is a red color, a light color of the plurality of second micro light emitting chips is a green color, and a light color of the plurality of third micro light emitting chips is a blue color.

17. The micro LED panel as claimed in claim 12, wherein each pixel region has two first solder portions, one second solder portion and one third solder portion disposed therein, and the two first solder portions, the one second solder portion and the one of third solder portion are arranged into a 2×2 matrix, and the two first solder portions are diagonally arranged with respect to each other.

18. The micro LED panel as claimed in claim 17, wherein the optical element carrier has a first positioning portion defined at a position without the plurality of pixel regions;

at least one process substrate has a second positioning portion, and the first positioning portion and the second positioning portion are configured to be corresponsive to each other to confirm a transferring and fixing position when the plurality of first micro light emitting chips, the plurality of second micro light emitting chips or the plurality of third micro light emitting chips are transferred and fixed to the optical element carrier.

19. The micro LED panel as claimed in claim 18, wherein when the optical element carrier already has some of the plurality of first micro light emitting chips, the plurality of second micro light emitting chips or the plurality of third micro light emitting chips, the at least one process substrate is transferred and fixed, and any one of the plurality of first micro light emitting chips, the plurality of second micro light emitting chips or the plurality of third micro light emitting chips is used as a positioning point to confirm the transferring and fixing position.

20. The micro LED panel as claimed in claim 19, wherein a light color of the plurality of first micro light emitting chips is a green color, a light color of the plurality of second micro light emitting chips is a blue color, and a light color of the plurality of third micro light emitting chips is a red color.

21. A method for manufacturing a micro LED panel, comprising the steps of:
   defining a plurality of pixel regions on an optical element carrier, each being arranged substantially into a matrix;
   setting a plurality of first solder portions in each pixel region;
   selecting a plurality of process substrates and defining a process area on each process substrate;
   setting a first process mode, wherein the first process mode uses the process area as a unit to calculate a number of units of the optical element carrier and then determining a number of process substrates of the first process mode according to the number of units, and the process area of a corresponding process substrate is configured to be corresponsive to the plurality of first solder portions to form a plurality of first micro light emitting chips;
   transferring and fixing the plurality of first micro light emitting chips on a single process substrate to a position of the plurality of first solder portions of the optical element carrier, and removing the single process substrate, until the plurality of first solder portions have the plurality of first micro light emitting chips; and
   spraying or attaching a photo-excited structure onto a portion of the plurality of first micro light emitting chips in each pixel region, so that each pixel region emits a white light.

22. The method for manufacturing a micro LED panel as claimed in claim 21, wherein the plurality of first solder portions in each pixel region are arranged in an X-axis direction or a Y-axis direction to form a 1×3 matrix, and each first solder portion has two first solder joints.

23. The method for manufacturing a micro LED panel as claimed in claim 22, wherein the plurality of process substrates is cut before the plurality of first micro light emitting chips are transferred and fixed and each process substrate is cut along an edge of the process area into a shape corresponding to the process area.

24. The method for manufacturing a micro LED panel as claimed in claim 22, wherein the optical element carrier has a first positioning portion defined at a position without the plurality of pixel regions; at least one of the process substrates has a second positioning portion, and the first positioning portion and the second positioning portion are configured to be corresponsive to each other to confirm a transferring and fixing position when the plurality of first micro light emitting chips are transferred and fixed to the optical element carrier.

25. The method for manufacturing a micro LED panel as claimed in claim 24, wherein when the optical element carrier already has some of the plurality of first micro light emitting chips, the plurality of process substrates are transferred and fixed, and any one of the plurality of first micro light emitting chips is used as a positioning point to confirm the transferring and fixing position.

26. The method for manufacturing a micro LED panel as claimed in claim 25, wherein a light color of a portion of the plurality of first micro light emitting chips without being sprayed or attached with the photo-excited structure is a blue color, and a light color of the portion of the plurality of first micro light emitting chips after being sprayed or attached with the photo-excited structure is a green color or a red color.

27. The method for manufacturing a micro LED panel as claimed in claim 21, wherein each pixel region has four first solder portions therein, and the four first solder portions are arranged in a 2×2 matrix, and each of the four first solder portions has two first solder joints.

28. The method for manufacturing a micro LED panel as claimed in claim 27, wherein the plurality of process substrates is cut before the plurality of first micro light emitting chips are transferred and fixed, so that each process substrate is cut along an edge of the process area into a shape corresponding to the process area.

29. The method for manufacturing a micro LED panel as claimed in claim 27, wherein the optical element carrier has a first positioning portion defined at a position without the plurality of pixel regions; at least one of the process substrates has a second positioning portion, and the first positioning portion and the second positioning portion are configured to be corresponsive to each other to confirm a transferring and fixing position when the plurality of first micro light emitting chips are transferred and fixed to the optical element carrier.

30. The method for manufacturing a micro LED panel as claimed in claim 29, wherein when the optical element carrier already has some of the plurality of first micro light emitting chips, the plurality of process substrates are transferred and fixed, and any one of the plurality of first micro light emitting chips is used as a positioning point to confirm theft transferring and fixing position.

31. The method for manufacturing a micro LED panel as claimed in claim 30, wherein a light color of a portion of the plurality of first micro light emitting chips without being sprayed or attached with the photo-excited structure is a blue color, a light color of the portion of the plurality of first micro light emitting chips after being sprayed or attached with the photo-excited structure is a green color or a red color, and a light color of two of the plurality of first micro light emitting chips in each pixel region after being sprayed or attached with the photo-excited structure is a green color, and the two of the plurality of first micro light emitting chips are diagonally arranged with respect to each other.

32. A micro LED panel manufactured by the manufacturing method as claimed in claim 21, comprising:
   an optical element carrier, having a plurality of pixel regions defined therein, and each pixel region being arranged substantially into a matrix;
   a plurality of first solder portions, disposed in the plurality of pixel regions respectively;

a plurality of first micro light emitting chips, soldered onto the plurality of first solder portions respectively; and a plurality of photo-excited structures, sprayed or attached onto some of the plurality of first micro light emitting chips in each pixel region, so that each pixel region emits a white light.

33. The micro LED panel as claim in 32, wherein the plurality of first solder portions in each pixel region are arranged along an X-axis direction or a Y-axis direction to form a 1×3 matrix, and each first solder portion has two first solder joints.

34. The micro LED panel as claim in 33, wherein the optical element carrier has a first positioning portion defined at a position without the plurality of pixel regions; at least one process substrate has a second positioning portion, and the first positioning portion and the second positioning portion are configured to be corresponsive to each other to confirm a transferring and fixing position when the plurality of first micro light emitting chips are transferred and fixed to the optical element carrier.

35. The micro LED panel as claim in 34, wherein when the optical element carrier already has some of the plurality of first micro light emitting chips, the at least one process substrate is transferred and fixed, and any one of the plurality of first micro light emitting chips is used as a positioning point to confirm the transferring and fixing position.

36. The micro LED panel as claim in 35, wherein a light color of others of the plurality of first micro light emitting chips without being sprayed or attached with the photo-excited structures is a blue color and a light color of the some of the plurality of first micro light emitting chips after being sprayed or attached with the photo-excited structures is a green color or a red color.

37. The micro LED panel as claim in 32, wherein each pixel region has four first solder portions arranged into a 2×2 matrix arrangement, and each of the four first solder portions has two first solder joints.

38. The micro LED panel as claim in 37, wherein the optical element carrier has a first positioning portion defined at a position without the plurality of pixel regions; at least one process substrate has a second positioning portion, and the first positioning portion and the second positioning portion are configured to be corresponsive to each other to confirm a transferring and fixing position when the plurality of first micro light emitting chips are transferred and fixed to the optical element carrier.

39. The micro LED panel as claim in 38, wherein when the optical element carrier already has some of the plurality of first micro light emitting chips, the at least one process substrate is transferred and fixed, and any one of the plurality of first micro light emitting chips is used as a positioning point to confirm the transferring and fixing position.

40. The micro LED panel as claim in 39, wherein a light color of others of the plurality of first micro light emitting chips without being sprayed or attached with the photo-excited structures is a blue color, and a light color of the some of the plurality of first micro light emitting chips after being sprayed or attached with the photo-excited structures is a green color or a red color, and a light color of two of the first micro light emitting chips in each pixel region after being sprayed or attached with the photo-excited structures is a green color, and the two of the first micro light emitting chips are arranged diagonally with respect to each other.

* * * * *